US012777714B2

(12) United States Patent
Xu et al.

(10) Patent No.: US 12,777,714 B2
(45) Date of Patent: Oct. 27, 2026

(54) DISPLAY PANEL AND DISPLAY APPARATUS

(71) Applicant: Tianma Advanced Display Technology Institute (Xiamen) Co., Ltd., Xiamen (CN)

(72) Inventors: Mingyan Xu, Xiamen (CN); Zhenyu Jia, Xiamen (CN); Yingteng Zhai, Xiamen (CN); Xueling Li, Xiamen (CN)

(73) Assignee: Tianma Advanced Display Technology Institute (Xiamen) Co., Ltd., Xiamen (CN)

( * ) Notice: Subject to any disclaimer, the term of this patent is extended or adjusted under 35 U.S.C. 154(b) by 0 days.

(21) Appl. No.: 19/237,587

(22) Filed: Jun. 13, 2025

(65) Prior Publication Data

US 2025/0311425 A1 Oct. 2, 2025

(30) Foreign Application Priority Data

Jan. 7, 2025 (CN) ......................... 202510024640.4

(51) Int. Cl.
*G09G 5/10* (2006.01)
*G09G 3/32* (2016.01)
*H10D 86/40* (2025.01)

(52) U.S. Cl.
CPC ............. *H10D 86/441* (2025.01); *G09G 3/32* (2013.01); *G09G 2300/026* (2013.01); (Continued)

(58) Field of Classification Search
CPC .. H10D 86/441; G09G 3/32; G09G 2300/026; G09G 2300/0819; G09G 2300/0852; G09G 2300/0861; G09G 2310/0286; G09G 2310/08; G09G 2320/0233; G09G 2320/0252; G09G 2320/0633; G09G 2320/064; G09G 2330/04
(Continued)

(56) References Cited

U.S. PATENT DOCUMENTS

2022/0199735 A1* 6/2022 Wang .................. G09G 3/3225
2022/0399378 A1* 12/2022 Xue ..................... H10D 86/443
(Continued)

*Primary Examiner* — Jennifer T Nguyen
(74) *Attorney, Agent, or Firm* — Christensen O'Connor Johnson Kindness PLLC

(57) ABSTRACT

A display panel includes a display area and driving signal lines. The display area includes circuit regions and trace regions. The circuit region includes circuit units including pixel driving circuits. The display area further includes first control signal line electrically connected to pixel driving circuit. The circuit region includes driving circuit. The driving circuit includes driving units at least partially arranged between two adjacent circuit units in the second direction, and the driving circuit is electrically connected to the first control signal line. The driving signal lines extend along the second direction and are electrically connected to the driving circuit. At least part of driving signal lines electrically connected to a same driving circuit along the first direction is arranged at a first side of the corresponding driving circuit, and at least another part of driving signal lines is arranged at a second side of the corresponding driving circuit.

20 Claims, 14 Drawing Sheets

(52) U.S. Cl.
CPC ............... *G09G 2300/0819* (2013.01); *G09G 2300/0852* (2013.01); *G09G 2300/0861* (2013.01); *G09G 2310/0286* (2013.01); *G09G 2310/08* (2013.01); *G09G 2320/0233* (2013.01); *G09G 2320/0252* (2013.01); *G09G 2320/0633* (2013.01); *G09G 2320/064* (2013.01); *G09G 2330/04* (2013.01)

(58) Field of Classification Search
USPC .......................................................... 345/691
See application file for complete search history.

(56) References Cited

U.S. PATENT DOCUMENTS

2023/0117897 A1* 4/2023 Kim ......................... G09G 3/32
345/691
2023/0317003 A1* 10/2023 In ......................... G09G 3/3233
2024/0029639 A1* 1/2024 Kim ....................... H10K 59/88

* cited by examiner

DISPLAY PANEL AND DISPLAY APPARATUS

CROSS-REFERENCE TO RELATED DISCLOSURE

The present disclosure claims priority to Chinese Patent Application No. 202510024640.4, filed on Jan. 7, 2025, the content of which is incorporated herein by reference in its entirety.

TECHNICAL FIELD

The present disclosure relates to the field of display technologies, and in particular, to a display panel and a display apparatus.

BACKGROUND

In order to control a pixel driving circuit in a display panel, a driving circuit that provides a control signal to the pixel driving circuit and multiple traces connected to the driving circuit must be provided in the display panel. At present, the driving circuit and the traces in the display panel occupy a large space in the display panel, which may limit the performance improvement of the display panel.

SUMMARY

An aspect of the disclosure provides a display panel. The display panel includes a display area and a plurality of driving signal lines. The display area includes a plurality of circuit regions and a plurality of trace regions that are alternately arranged along a first direction. One of the plurality of circuit regions includes a plurality of circuit units arranged along a second direction. The plurality of circuit units includes a pixel driving circuit, and the first direction intersects with the second direction. The display area further includes first control signal lines electrically connected to at least part of pixel driving circuits. At least part of the circuit regions includes a driving circuit which includes a plurality of driving units that are at least partially arranged between two adjacent circuit units in the second direction. The driving circuit is electrically connected to one of the first control signal lines. The driving signal lines extend along the second direction and are electrically connected to the driving circuit. Along the first direction, at least part of the driving signal lines electrically connected to the driving circuit is arranged on a first side of a corresponding driving circuit, and at least another part of the driving signal lines is arranged on a second side of the corresponding driving circuit.

Another aspect of the present disclosure provides a display apparatus. The display apparatus includes a display panel. The display panel includes a display area and a plurality of driving signal lines. The display area includes a plurality of circuit regions and a plurality of trace regions that are alternately arranged along a first direction. One of the plurality of circuit regions includes a plurality of circuit units arranged along a second direction. The one or more circuit units includes a pixel driving circuit, and the first direction intersects with the second direction. The display area further includes first control signal lines electrically connected to at least part of pixel driving circuits. At least part of the circuit regions includes a driving circuit, which includes driving units that are at least partially arranged between two adjacent circuit units in the second direction, and the driving circuit is electrically connected to one of the first control signal lines. The driving signal lines extend along the second direction and are electrically connected to the driving circuit. Along the first direction, at least part of the plurality of driving signal lines electrically connected to the driving circuit is arranged on a first side of a corresponding driving circuit, and at least another part of the driving signal lines is arranged on a second side of the corresponding driving circuit.

BRIEF DESCRIPTION OF DRAWINGS

In order to describe the technical solutions in the embodiments of the present disclosure more clearly, the drawings desired in the description of the embodiments will be briefly given as follows. It should be understood that the drawings in the following description are only some of the embodiments of the present disclosure. For those ordinarily skilled in the art, other drawings can also be obtained in accordance with these drawings.

DESCRIPTION OF EMBODIMENTS

In order to better understand the technical solutions of the present disclosure, the following is a detailed description of the embodiments of the present disclosure with reference to the drawings.

It is to be made clear that the described embodiments are only some rather than all of the embodiments of the present disclosure. All other embodiments obtained by those skilled in the art based on the embodiments of the present disclosure without creative efforts should fall within a scope of the present disclosure.

Terms used in the embodiments of the present disclosure are merely for the purpose of describing specific embodiments, but not intended to limit the present disclosure. The singular forms of "a", "an" and "the" used in the embodiments of the present disclosure and the appended claims are also intended to include plural forms, unless clearly indicating others.

It should be understood that the term "and/or" used herein is merely an association relationship describing an associated object, indicating that there may be three relationships, for example, A and/or B, and may indicate: only A, both A and B, and only B. In addition, the character "/" herein generally indicates an "or" relationship between the associated objects.

Figure 1:
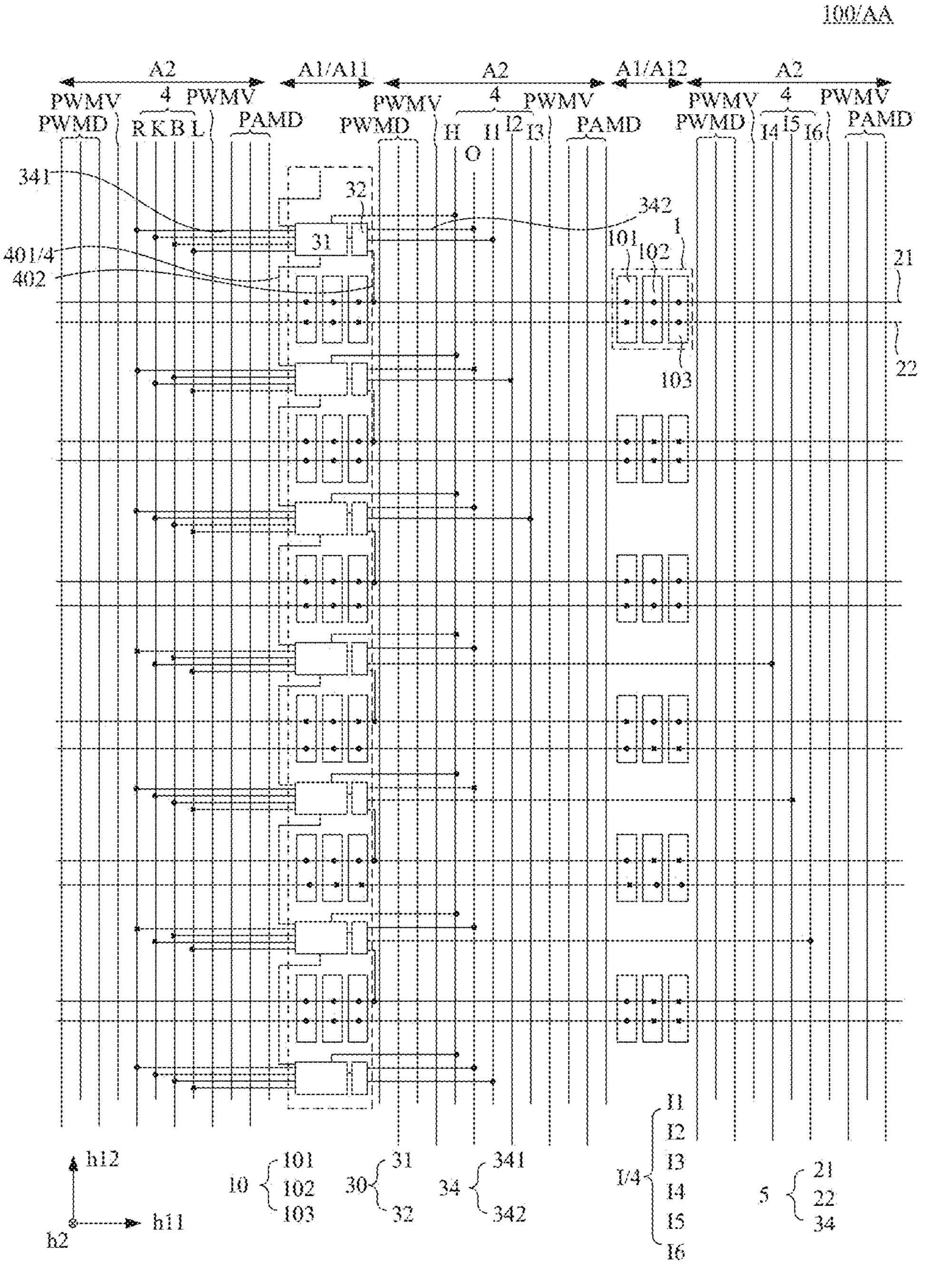
FIG. 1 is a top view of a display panel according to an embodiment of the present disclosure.

The present disclosure provides a display panel, as shown in FIG. 1, which is a top view of a display panel 100 according to an embodiment of the present disclosure. The display panel 100 includes a display area AA, and the display area AA includes a circuit region A1 and a trace region A2 that are alternately arranged along a first direction h11. The circuit region A1 includes circuit units 1 arranged along a second direction h12, and the circuit units 1 include a pixel driving circuit 10. The first direction h11 intersects with the second direction h12.

As shown in FIG. 1, the display area AA further includes a first control signal line 21 that is electrically connected to at least part of the pixel driving circuit 10. The first control signal line 21 may generate a driving current via the pixel driving circuit 10, to drive a light-emitting element (not shown in FIG. 1) to emit light.

In an embodiment of the present disclosure, at least part of the circuit region A1 includes a driving circuit 30, and the driving circuit 30 includes at least one cascaded driving unit 300. The driving unit 300 is at least partially arranged between two adjacent circuit units 1 along the second direction h12, and the driving unit 300 is electrically connected to the first control signal line 21.

The driving circuit 30 may be arranged in the circuit region A1 so that the space of the circuit region A1 can be reasonably utilized. The driving circuit 30 does not need to occupy the left and right frame space of the display panel 100 in the first direction h11, thereby realizing a left and right ultra-narrow frame design or a left and right frameless design of the display panel 100.

Moreover, when the display panel 100 is applied to a spliced display apparatus, for two adjacent display panels 100 in the first direction h11, a spacing between the display areas AA of the two adjacent display panels 100 may also be reduced, thereby weakening a visual seam in the tiled display apparatus in the first direction h11.

As shown in FIG. 1, the display panel 100 may further include driving signal lines 4 extending along the second direction h12. In some embodiments, the driving signal lines 4 are arranged in the trace region A2, and the driving signal lines 4 are electrically connected to the driving circuit 30. In an embodiment of the present disclosure, at least part of the drive signal lines 4 are electrically connected to the input terminal of the drive circuit 30. The driving circuit 30 may include multiple input terminals, and the driving signal lines 4 are electrically connected in one-to-one correspondence to the input terminals.

When the display panel 100 is operating, the driving signal line 4 may provide a driving signal to the driving circuit 30. Under the action of the driving signal, the driving circuit 4 may generate a first control signal, and the first control signal may be provided to the pixel driving circuit 10 through the first control signal line 21, to generate a driving current via the pixel driving circuit 10 and light up a light-emitting element electrically connected to the pixel driving circuit 10.

In an embodiment of the present disclosure, along the first direction h11, at least part of the driving signal lines 4 electrically connected to a same driving circuit 30 is arranged at a first side of the corresponding driving circuit 30, and at least another part of the driving signal lines 4 is arranged at a second side of the corresponding driving circuit 30. The driving circuit 30 corresponding to the driving signal line 4 refers to the driving circuit 30 electrically connected to the driving signal line 4.

Based on such arrangement, the driving signal lines 4 may be dispersedly arranged at both sides of the corresponding driving circuit 30 in the first direction h11. Compared to the embodiment in which the driving signal lines 4 are centrally arranged at the same side of the corresponding driving circuit 30, the available wiring space for the driving signal lines 4 is increased, and the space on both sides of the driving circuit 30 in the display panel 100 in the first direction h11 can be fully utilized, thereby improving a space utilization rate at different positions in the display panel 100.

Moreover, by adopting such an arrangement, the number of the driving signal lines 4 arranged at any side of the driving circuit 30 may be reduced. When the space on any side of the driving circuit 30 is constant, the line width of a single driving signal line 4 may be increased, thereby reducing the resistance of the driving signal line 4, as well as the delay of a signal during transmission. In addition, the number of the driving signal lines 4 that can be accommodated may also be increased. For example, more input terminals may be provided in the driving circuit 30 according to different requirements, and more driving signal lines 4 electrically connected to the input terminal of the driving circuit 30 may be provided to increase the design flexibility of the driving circuit 30, thereby reducing the design limitation of space factors on the driving circuit 30 and avoiding the space factors restricting the performance improvement of the driving circuit 30.

It should be noted that the position of the driving circuit 30 in the display area AA in FIG. 1 is merely an example. The circuit region A1 including the driving circuit 30 is defined as the first circuit region A11, and the circuit region A1 not including the driving circuit 30 is defined as the second circuit region A12. In an embodiment of the present disclosure, the first circuit region A11 can be arranged to be adjacent to an edge of the display area AA, that is, the second circuit region A12 is not provided between the first circuit region A11 and the edge of the display area AA.

In an embodiment of the present disclosure, the first circuit region A11 may be arranged in a middle region of the display area AA. For example, the second circuit region A12 may be arranged between the first circuit region A11 and the edge of the display area AA.

When the first circuit region A11 is arranged in the middle region of the display area AA, the first circuit region A11 may be centrally arranged with respect to the display area AA in an embodiment of the present disclosure. That is, the same number of second circuit regions A12 (±1) may be arranged at the first side and the second side of the first circuit region A11 in the first direction h11.

In an embodiment of the present disclosure, the number of the second circuit regions A12 on one of the first side and the second side may be greater than the number of the second circuit regions A12 on the other of the first side and the second side. For example, in an embodiment of the present disclosure, when the display area AA includes a total of K circuit regions A1, and K is an odd number greater than 3, the first side of the first circuit region A11 includes $(K-1)/4$ second circuit regions A12, and the second side of the first circuit region A11 includes $3(K-1)/4$ second circuit regions A12.

In an embodiment of the present disclosure, as shown in FIG. 1, the driving circuit 30 includes a control module 31 and an output module 32 that are electrically connected to each other.

In an embodiment of the present disclosure, the control module 31 and the output module 32 are arranged along the first direction h11, to reduce the width of the driving circuit 30 in the second direction h12.

In an embodiment of the present disclosure, as shown in FIG. 1, along the first direction h11, the control module 31 is arranged at a side of the driving circuit 30 adjacent to the first side, and the output module 32 is arranged at a side of the driving circuit 30 adjacent to the second side.

In an embodiment of the present disclosure, the display panel 100 includes q1 driving signal lines 4 arranged on a first side of the corresponding driving circuit 30, and q2 driving signal lines 4 arranged on a second side of the corresponding driving circuit 30, where $q1<q2$. In addition, at least one of the driving signal lines 4 arranged at the first side of the corresponding driving circuit 30 may be electrically connected to the control module 31, and at least one of the driving signal lines 4 arranged at the second side of the corresponding driving circuit 30 may be electrically connected to the output module 32. As shown in FIG. 1, $q1=4$, $q2=8$, four driving signal lines 4 arranged at the first side of the corresponding driving circuit 30 are all electrically connected to the control module 31, seven driving signal lines 4 arranged at the second side of the corresponding driving circuit 30 are all electrically connected to the output module 32, and one driving signal line 4 is electrically connected to the control module 31.

In an embodiment of the present disclosure, as shown in FIG. 1, the display panel further includes multiple connection lines 34 connecting the driving signal lines 4 and the corresponding driving circuits 30, and the connection lines 34 includes a first connection line 341 arranged at the first side of the corresponding driving circuit 30 and a second connection line 342 arranged at the second side of the driving circuit 30. At least part of the first connection line 341 is connected to the control module 31, and at least part of the second connection line 342 is connected to the output module 32.

In an embodiment of the present disclosure, at least one of the driving signal lines 4 arranged at the first side of the corresponding driving circuit 30 is electrically connected to the control module 31 adjacent to the first side in the driving circuit 30, so that a distance between the driving signal line 4 and the control module 31 connected to the driving signal line 4 may be shortened, thereby shortening the length of the first connection line 341 connecting the driving signal line 4 and the driving circuit 30. This may result in reducing the resistance of the first connection line 341 and reducing the delay of a signal transmitted by the first connection line 341.

In an embodiment of the present disclosure, at least one of the driving signal lines 4 arranged at the second side of the corresponding driving circuit 30 is electrically connected to the output module 32 adjacent to the second side in the driving circuit 30, so that a distance between the driving signal line 4 and the output module 32 connected to the driving signal line 4 can be shortened, thereby shortening the length of the second connection line 342 connecting the driving signal line 4 and the driving circuit 30. This may result in reducing the resistance of the second connection line 342 and reducing the delay of a signal transmitted by the second connection line 342.

Figure 2:
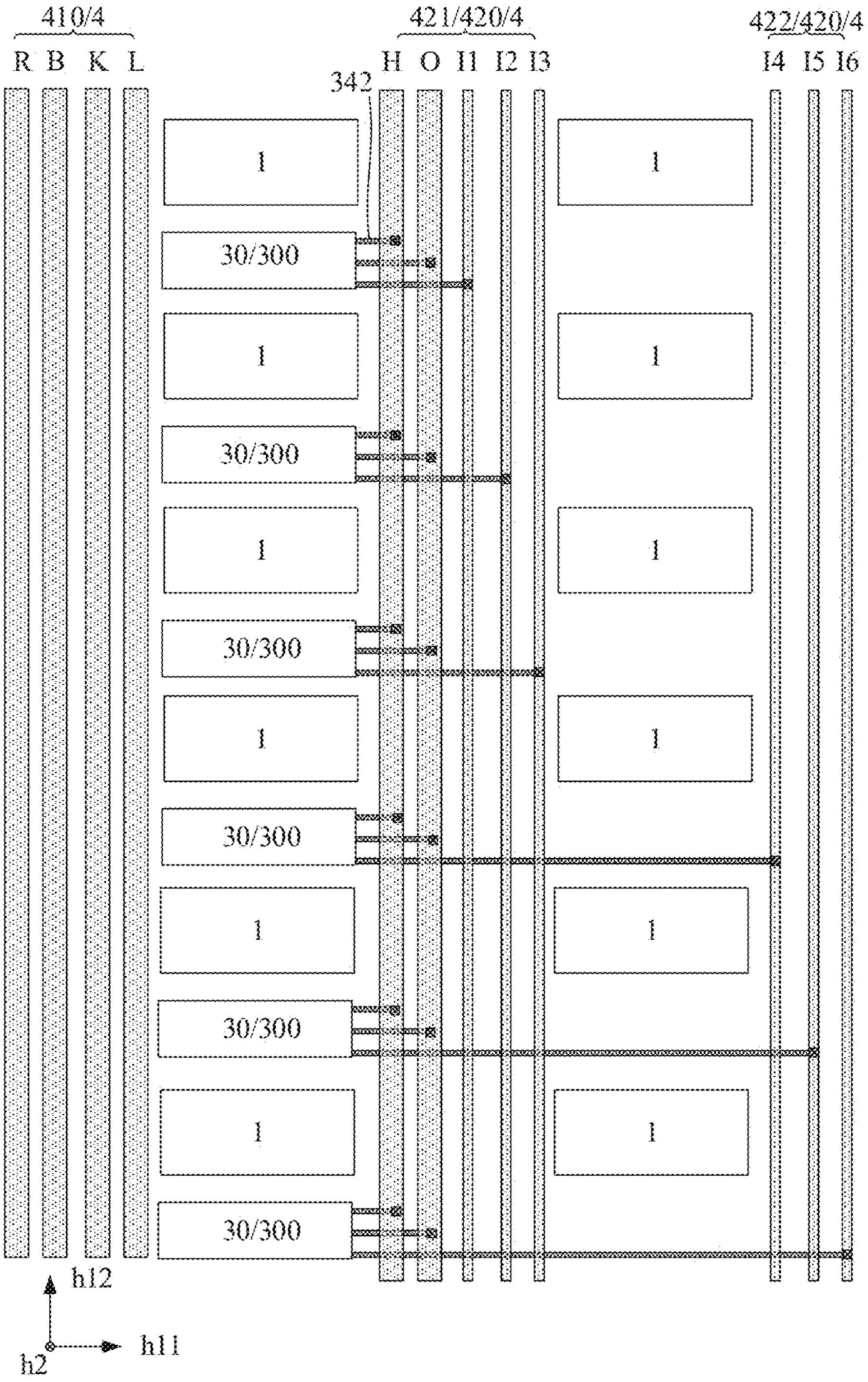
FIG. 2 is a wiring diagram of driving signal lines according to an embodiment of the present disclosure.

In an embodiment of the present disclosure, as shown in FIG. 2, which is a wiring diagram of driving signal lines according to an embodiment of the present disclosure, a line width of at least one driving signal line 4 arranged at a first side of a corresponding driving circuit 30 is greater than a line width of at least one driving signal line 4 arranged at a second side of the corresponding driving circuit 30. The driving signal line 4 may have a reflectivity. Based on such arrangement, in combination with the above-mentioned arrangement of $q1<q2$, an area of the driving signal line 4 provided at the first side and the second side of the driving circuit 30 in the display panel can be balanced, thereby improving the reflection uniformity of the first side and the second side of the driving circuit 30 and improving the display effect of the display panel.

In an embodiment of the present disclosure, the driving signal line 4 arranged at the first side of the driving circuit 30 includes at least two first driving signal line groups 410, and the first driving signal line group 410 includes at least one driving signal line 4. Along the first direction h11, at least one circuit unit 1 is included between two adjacent first driving signal line groups 410.

Figure 3:
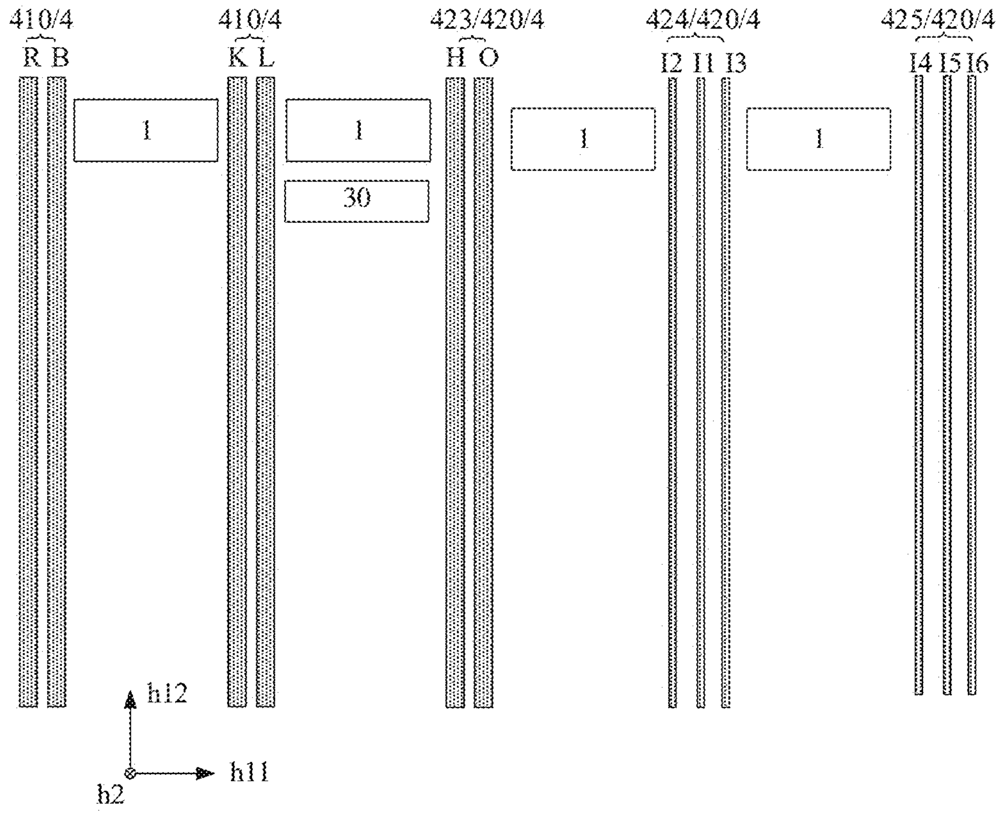
FIG. 3 is a wiring diagram of driving signal lines according to another embodiment of the present disclosure.

FIG. 3 is a wiring diagram of driving signal lines according to another embodiment of the present disclosure, in which the driving signal line 4 arranged at the first side of the driving circuit 30 includes two first driving signal line groups 410. In an embodiment of the present disclosure, the driving signal lines 4 arranged at the first side of the driving circuit 30 are further divided into at least two first driving signal line groups 410, so that the driving signal lines 4 arranged at the first side of the driving circuit 30 may be dispersedly arranged, to reduce the number of the driving signal lines 4 between two adjacent circuit units 1 arranged at the first side of the driving circuit 30, thereby facilitating an increasing line width for the driving signal lines 4 arranged at the first side of the driving circuit 30.

In an embodiment of the present disclosure, the driving signal line 4 arranged at the second side of the driving circuit 30 includes at least two second driving signal line groups 420, and the second driving signal line group 420 includes at least one driving signal line 4. Along the first direction h11, at least one circuit unit 1 may be included between two adjacent second driving signal line groups 420. FIG. 2 illustrates that the driving signal line 4 arranged at the second side of the driving circuit 30 includes two second driving signal line groups 420, and FIG. 3 illustrates that the driving signal line 4 arranged at the second side of the driving circuit 30 includes three second driving signal line groups 420. In an embodiment of the present disclosure, the driving signal lines 4 arranged at the second side of the driving circuit 30 are further divided into at least two second driving signal line groups 420, so that the driving signal lines 4 arranged at the second side of the driving circuit 30 can be dispersedly arranged, to reduce the number of the driving signal lines 4 between two adjacent circuit units 1 arranged at the second side of the driving circuit 30, thereby facilitating increasing the line width of the driving signal lines 4 arranged at the second side of the driving circuit 30.

In an embodiment of the present disclosure, as shown in FIG. 2, the at least two second driving signal line groups 420 arranged at the second side of the driving circuit 30 at least include a first subgroup 421 and a second subgroup 422 that is arranged at a side of the first subgroup 421 away from the corresponding driving circuit 30. In this embodiment, the first subgroup 421 includes q21 driving signal lines 4, and the second subgroup 422 includes q22 driving signal lines 4, where q21>q22. FIG. 2 illustrates that q21=5, and q22=3. Based on such arrangement, more driving signal lines 4 may be located adjacent to the driving circuit 30, so that more second connection lines 342 may have a shorter length, thereby reducing the resistance of the second connection lines 342 and reducing the delay of a signal transmitted by the second connection lines 342.

In an embodiment of the present disclosure, as shown in FIG. 3, the driving signal lines 4 arranged at the first side of the driving circuit 30 includes two first driving signal line groups 410, and the driving signal lines 4 arranged at the second side of the driving circuit 30 includes three second driving signal line groups 420. Each of the two first driving signal line groups 410 may include two driving signal lines 4. Each of the three second driving signal line groups 420 may include a third subgroup 423, a fourth subgroup 424 and a fifth subgroup 425. The third subgroup 423 may be arranged at a side of the fourth subgroup 424 adjacent to the corresponding driving circuit 30, and the fifth subgroup 425 may be arranged at a side of the fourth subgroup 424 away from the corresponding driving circuit 30. The third subgroup 423 may include two driving signal lines 4, and each of the fourth subgroup 424 and the fifth subgroup 425 may include three driving signal lines 4. Based on such arrangement, on one hand, the driving signal lines 4 arranged at the first side and the second side of the driving circuit 30 may be more dispersed, which may further reduce the number of the driving signal lines 4 between two adjacent circuit units 1 arranged at both sides of the driving circuit 30, and increasing the line width of the driving signal lines 4 arranged at both sides of the driving circuit 30. In another embodiment, the number of the driving signal lines 4 in the first driving signal line group 410, the third subgroup 423, the fourth subgroup 424 and the fifth subgroup 425 may be consistent, improving the reflection uniformity at different positions of the display panel.

In an embodiment of the present disclosure, as shown in FIG. 3, a total line width of the two driving signal lines 4 in the third subgroup 423 is equal to a total line width of the two driving signal lines 4 in the first driving signal line group 410. A line width of at least one driving signal line 4 in the fourth subgroup 424 and the fifth subgroup 425 may be less than a line width of at least one driving signal line 4 in the third subgroup 423. Based on such arrangement, the total line width of the driving signal lines 4 in the first driving signal line group 410, the third subgroup 423, the fourth subgroup 424 and the fifth subgroup 425 may be consistent, improving the reflection uniformity at different positions of the display panel.

In an embodiment of the present disclosure, a total line width of the driving signal lines 4 in the third subgroup 423 is d1, a total line width of the driving signal lines 4 in the fourth subgroup 424 is d2, and a total line width of the driving signal lines 4 in the fifth subgroup 425 is d3, where $$\frac{d2-d1}{d1} \leq 30\%, \text{ and } \frac{d3-d1}{d1} \leq 30\%.$$

Based on such arrangement, the total line width of the driving signal lines 4 in the first driving signal line group 410, the third subgroup 423, the fourth subgroup 424 and the fifth subgroup 425 may be consistent, improving the reflection uniformity at different positions of the display panel.

Figure 4:
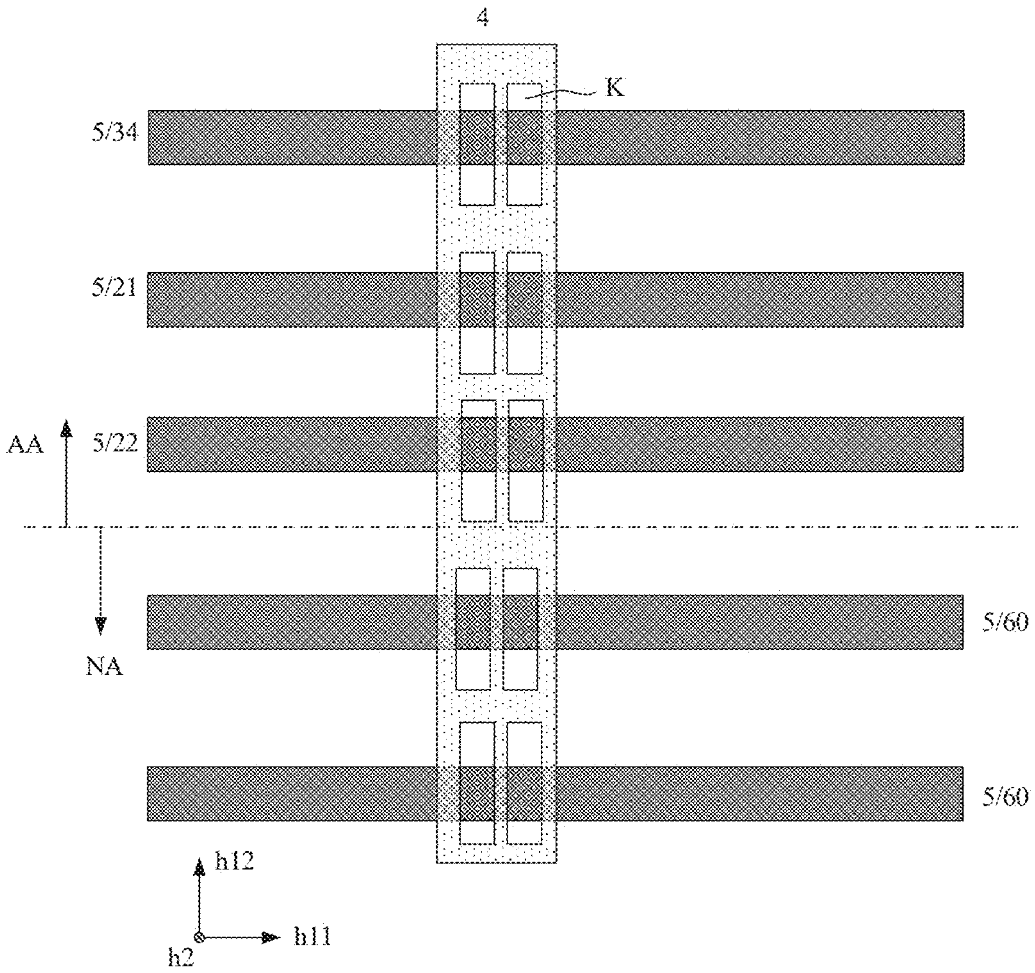
FIG. 4 is a schematic diagram of a driving signal line and a first signal line according to an embodiment of the present disclosure.

FIG. 4 is a schematic diagram of a driving signal line and a first signal line according to an embodiment of the present disclosure. In an embodiment of the present disclosure, as shown in FIG. 1 and FIG. 4, the display panel 100 further includes a first signal line 5 extending along the first direction h11, and signals transmitted by the first signal line 5 and the driving signal line 4 are different. Along a direction h2 perpendicular to a plane of the display panel 100, the driving signal line 4 at least partially overlaps the first signal line 5.

As shown in FIG. 4, the driving signal line 4 may include at least one through hole K, and the through hole K at least partially overlaps the first signal line 5 along a direction perpendicular to a plane of the display panel 100. The arrangement of the through hole K may reduce an overlapping area of the driving signal line 4 and the first signal line 5, reducing the coupling capacitance between the driving signal line 4 and the first signal line 5.

In an embodiment of the present disclosure, as shown in FIG. 2, the display panel 100 further includes a second control signal line 22 that is electrically connected to at least part of the pixel driving circuit 10, and the second control signal line 22 is not connected to the driving circuit 30. The second control signal line 22 may be another signal line different from the first control signal line 21 and configured to control the pixel driving circuit 10.

In an embodiment of the present disclosure, referring to FIG. 2 and FIG. 4, a first part of the first signal lines 5 includes the first control signal line 21, a second part of the first signal lines 5 includes the second control signal line 22, and a third part of the first signal lines 5 includes the connection line 34. As shown in FIG. 4, a fourth part of the first signal lines 5 may include an electrostatic protection signal line 60 arranged in a non-display area NA of the display panel.

Figure 5:
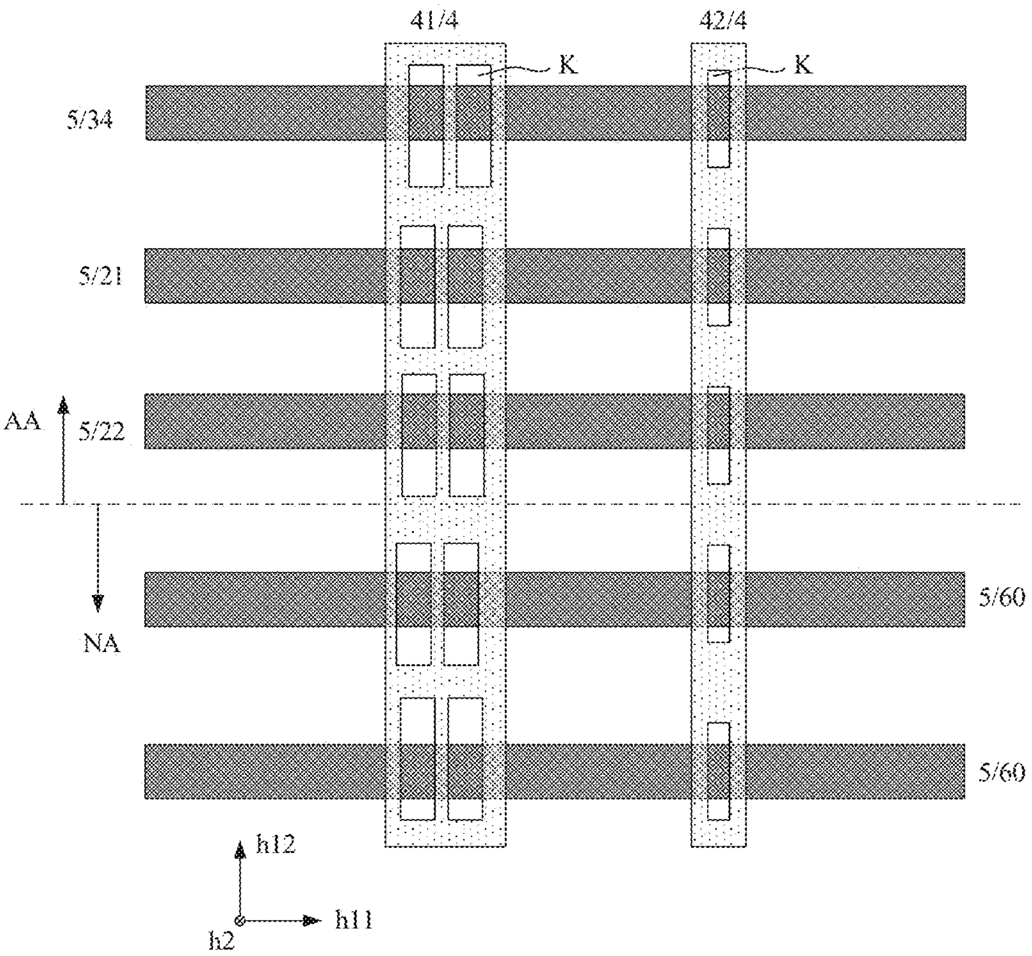
FIG. 5 is a schematic diagram of driving signal lines and first signal lines according to another embodiment of the present disclosure.

FIG. 5 is a schematic diagram of driving signal lines and first signal lines according to another embodiment of the present disclosure. In the illustrated embodiment, the driving signal line 4 includes a first driving signal line 41 and a second driving signal line 42, and a line width of the first driving signal line 41 is greater than a line width of the second driving signal line 42.

An area of the through hole K in the first driving signal line 41 may be greater than an area of the through hole K in the second driving signal line 42. In such an embodiment, the area of the through hole K may be matched with the line width of the driving signal line 4, and different through holes K may be provided for the driving signal lines 4 having different line widths, such that the coupling capacitance between the driving signal lines 4 having different line widths and the first signal line 5 may be reduced. This may reduce the signal delay of the driving signal lines 4 having different line widths and improve the display effect.

Figure 6:
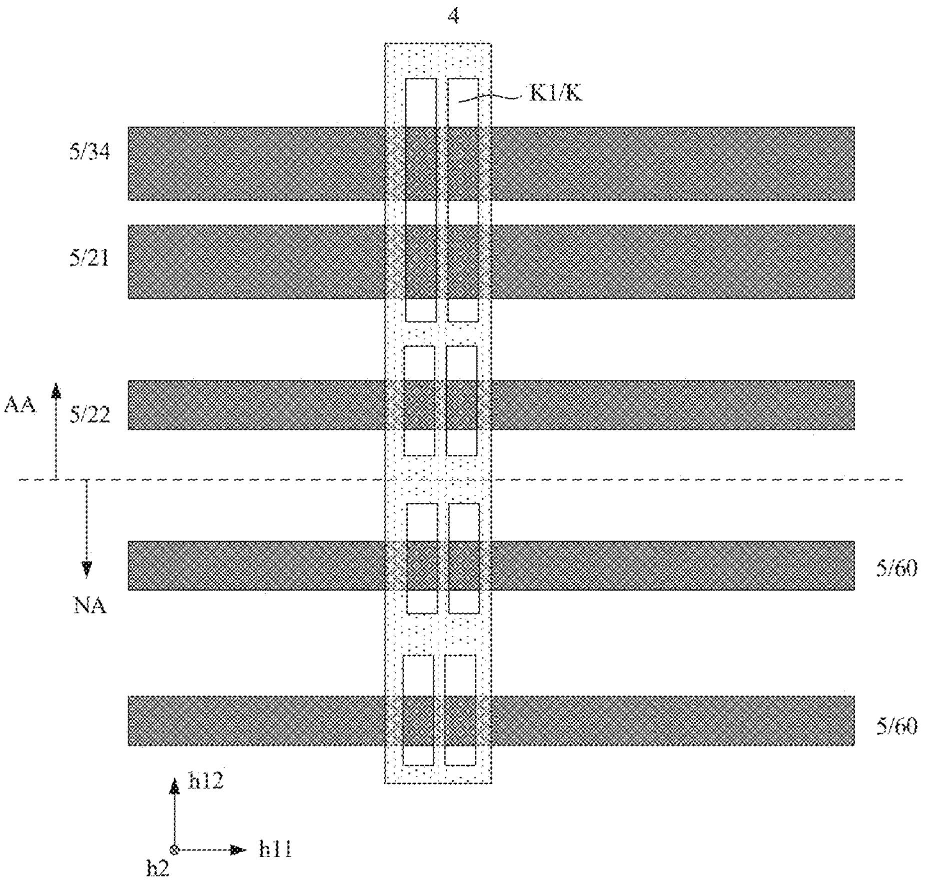
FIG. 6 is a schematic diagram of driving signal lines and first signal lines according to another embodiment of the present disclosure.

In an embodiment of the present disclosure, as shown in FIG. 6, which is a schematic diagram of driving signal lines and first signal lines according to another embodiment of the present disclosure, the at least one through hole K includes a first through hole K1, and the first through hole K1 overlaps at least two adjacent first signal lines 5 along a direction h2 perpendicular to a plane of the display panel 100. In such an embodiment, the overlapping capacitance between the driving signal line 4 and the two first signal lines 5 may be reduced at the same time, and the difficulty of configuring the first through hole K1 may be reduced.

Figure 7:
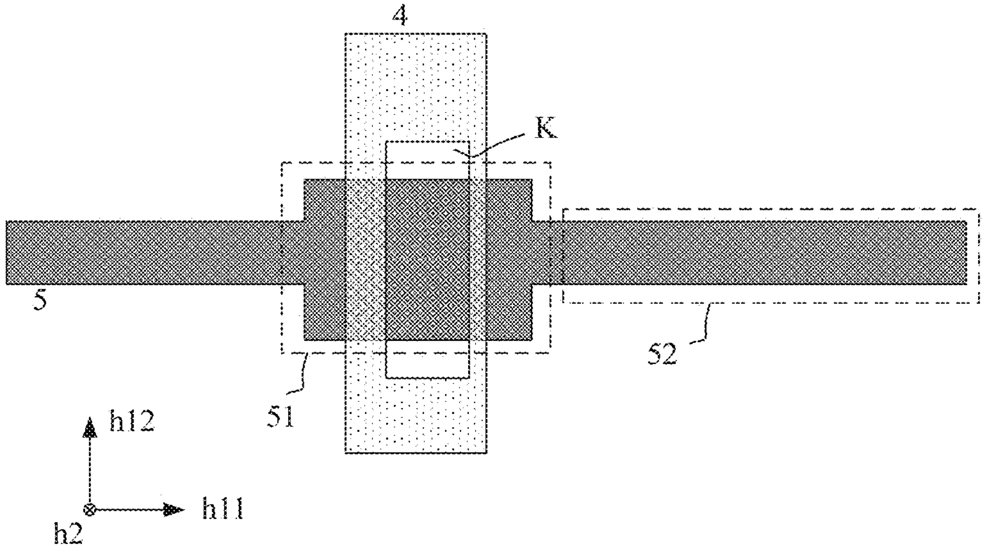
FIG. 7 is a schematic diagram of driving signal lines and first signal lines according to another embodiment of the present disclosure.

FIG. 7 is a schematic diagram of driving signal lines and first signal lines according to another embodiment of the present disclosure. In the illustrated embodiment, the first signal line 5 includes a first sub-signal line 51 and a second sub-signal line 52. In an embodiment of the present disclosure, the first sub-signal line 51 may be electrically connected to the second sub-signal line 52, and the first sub-signal line 51 and the second sub-signal line 52 may be regarded as two parts in the extension direction of the first signal line 5. Along a direction h2 perpendicular to a plane of the display panel 100, the first sub-signal line 51 at least partially overlaps the through hole K, and the second sub-signal line 52 at least partially does not overlap the through hole K, as shown in FIG. 7. A line width of the first sub-signal line 51 may be greater than or equal to a line width of the second sub-signal line 52. In such an embodiment, a sectional area of the first sub-signal line 51 may be increased, thereby reducing the resistance of the first sub-signal line 51 and reducing the resistance of the first signal line 5.

Figure 8:
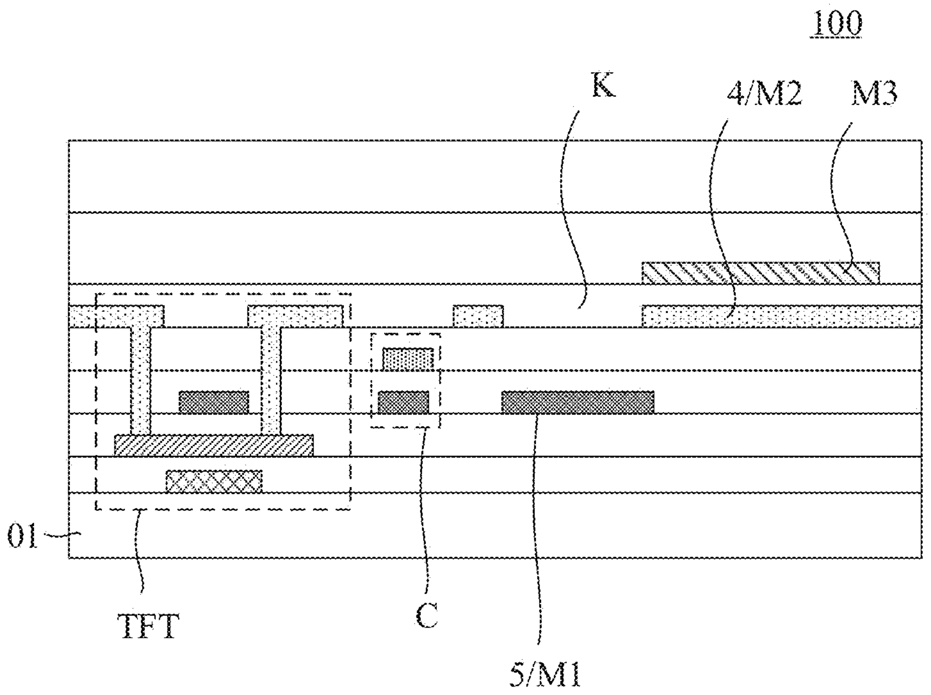
FIG. 8 is a sectional diagram of a display panel according to an embodiment of the present disclosure.

FIG. 8 is a sectional diagram of a display panel according to an embodiment of the present disclosure. In the illustrated embodiment, the display panel 100 further includes a substrate 01, and the driving signal line 4 is arranged at a side of the first signal line 5 away from the substrate 01 along a direction h2 perpendicular to a plane of the substrate. In an embodiment of the present disclosure, the conductivity of the driving signal line 4 may be greater than the conductivity of the first signal line 5. In an embodiment of the present disclosure, a through hole is avoided forming in the first signal line 5 by starting a through hole in the driving signal line 4, thereby avoiding increasing the resistance of the first signal line 5.

In an embodiment of the present disclosure, as shown in FIG. 8, the display panel 100 further includes a first metal layer M0, a semiconductor layer S, a second metal layer M1, a third metal layer MC, a fourth metal layer M2, and a fifth metal layer M3 that are sequentially arranged along a direction away from the substrate 01. The first signal line 5 may be located in the second metal layer M1, and the driving signal line 4 may be located in the fourth metal layer M2.

As shown in FIG. 8, the driving circuit further includes a transistor TFT and a capacitor C. The first metal layer M0 includes a bottom gate of the transistor TFT, and the second metal layer M1 includes a top gate of the transistor TFT. The semiconductor layer S includes a channel of the transistor TFT, and the third metal layer MC includes the capacitor C.

Figure 9:
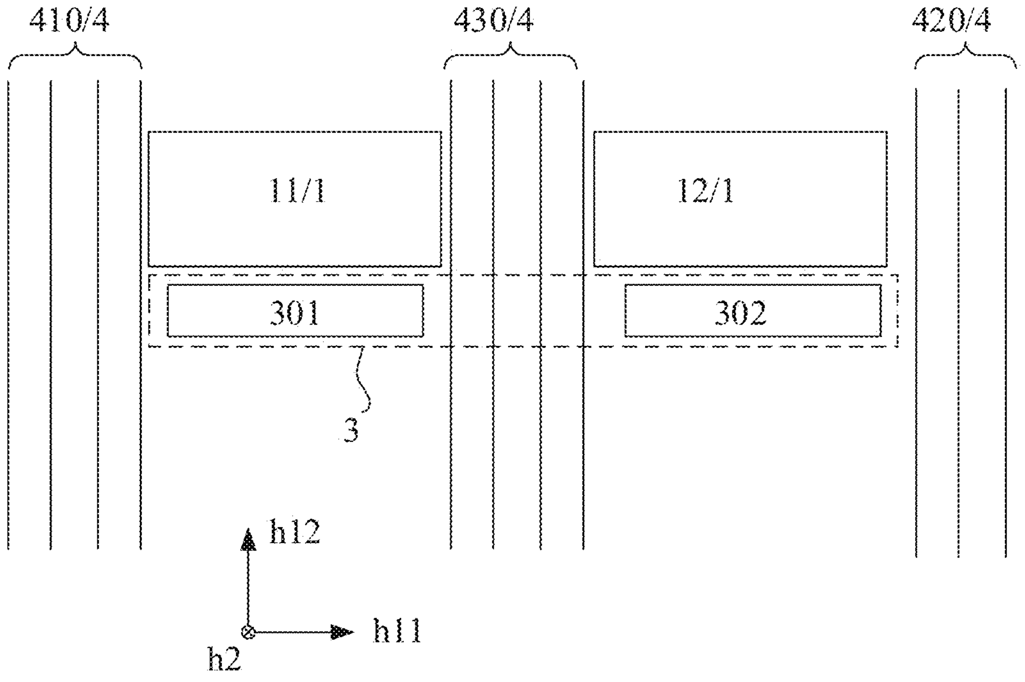
FIG. 9 is a wiring diagram of driving signal lines and driving units according to another embodiment of the present disclosure.

FIG. 9 is a wiring diagram of driving signal lines and driving units according to another embodiment of the present disclosure. In the illustrated embodiment, the circuit units 1 at least include a first circuit unit 11 and a second circuit unit 12 arranged along a first direction h11, and the driving circuit 30 includes a first portion 301 and a second portion 302 arranged along the first direction h11. The first portion 301 corresponds to the first circuit unit 11, and the second portion 302 corresponds to the second circuit unit 12. That is, the first portion 301 at least partially overlaps the first circuit unit 11 in a second direction h12, and the second portion 302 at least partially overlaps the second circuit unit 12 in the second direction h12.

As shown in FIG. 9, the driving signal lines 4 may further include a third driving signal line group 430 arranged between the first portion 301 and the second portion 302. Based on such arrangement, the width of the driving circuit 30 in the first direction h11 may be increased. The wiring space of the driving signal lines 4 may be increased by providing the third driving signal line group 430. When the total number of the driving signal lines 4 is constant, the number of the driving signal lines in the first driving signal line group 410 or the second driving signal line group 420 may be reduced, which may further increase the line width of the driving signal lines 4 in the first driving signal line group 410 or the second driving signal line group 420, thereby reducing the resistance, and reducing the signal delay.

In an embodiment of the present disclosure, as shown in FIG. 1, the driving circuit 30 includes a control module 31 and an output module 32 arranged along the first direction h11. The control module 31 may be arranged at a side of the driving circuit 30 adjacent to the first side, and the output module 32 may be arranged at a side of the driving circuit 30 adjacent to the second side. The driving signal line 4 may include at least one first input signal line I electrically connected to the output module 32, and the at least one first input signal line I may be arranged at the second side of the driving circuit 30. Based on such an embodiment, the distance between the first input signal line I and the output module 32 may be reduced, which may in turn shorten the length of the connection line between the first input signal line I and the output module 32, thereby reducing the resistance of the connection line, and reducing the signal delay.

Figure 10:
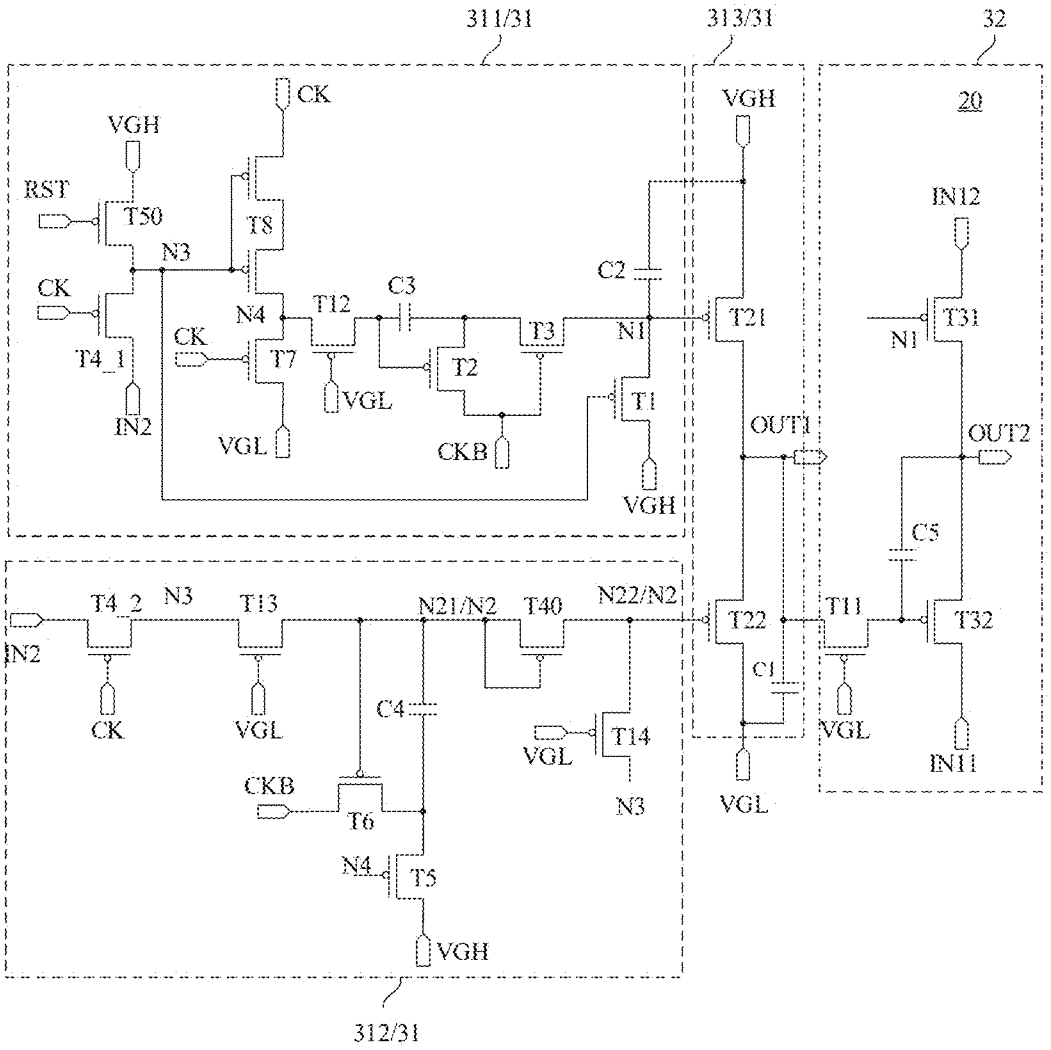
FIG. 10 is a circuit diagram of a driving unit according to an embodiment of the present disclosure.

FIG. 10 is a circuit diagram of a driving unit according to an embodiment of the present disclosure. In the illustrated embodiment, the control module 31 includes a first sub-control module 311, a second sub-control module 312, and a third sub-control module 313. The first sub-control module 311 may be configured to provide a first node signal to a first node N1, and the second sub-control module 312 may be configured to provide a second node signal to a second node N2. The third sub-control module 313 may be configured to electrically connect a second level signal terminal VGH and a first output signal terminal OUT1 under control of the first node signal, and electrically connect a first level signal terminal VGL and the first output signal terminal OUT1 under control of the second node signal. The output module 32 may be configured to electrically connect a second input signal terminal IN12 and a second output signal terminal OUT2 under control of the first node signal, and electrically connect a first input signal terminal IN11 and the second output signal terminal OUT2 under control of the output signal of the first output signal terminal OUT1. When the first output signal terminal OUT1 outputs an enable level, a signal of the first input signal terminal IN11 may be input into a pixel driving circuit 10 of a current row through the second output signal terminal OUT2.

In an example embodiment, as shown in FIG. 10, the first sub-control module 311 includes a first transistor T1, a second transistor T2, a third transistor T3, a fourth transistor T4_1, a reset transistor T50, a seventh transistor T7, an eighth transistor T8, and a twelfth transistor T12.

The second sub-control module 312 may include a fourth transistor T4_2, a fifth transistor T5, a sixth transistor T6, a thirteenth transistor T13, and a regulating transistor T40.

Gates of the fourth transistor T4_1 and the fourth transistor T4_2 may be electrically connected to a first clock signal terminal CK, and a first electrode is electrically connected to the third input signal terminal IN2. Gates of the second transistor T2 and the third transistor T3 and a first electrode of the sixth transistor T6 may be electrically connected to a second clock signal terminal CKB.

For the next stage driving unit 300, gates of the fourth transistor T4_1 and the fourth transistor T4_2 may be electrically connected to a second clock signal terminal CKB, and a first electrode is electrically connected to the third input signal terminal IN2. Gates of the second transistor T2 and the third transistor T3 and a first electrode of the sixth transistor T6 may be electrically connected to the first clock signal terminal CK.

The third sub-control module 313 may include a first output transistor T21 electrically connected to the second level signal terminal VGH, and a second output transistor T22 electrically connected to the first level signal terminal VGL.

The output circuit 32 may include a third output transistor T31 electrically connected to the second input signal terminal IN12, and a fourth output transistor T32 electrically connected to the first input signal terminal IN11.

Figure 11:
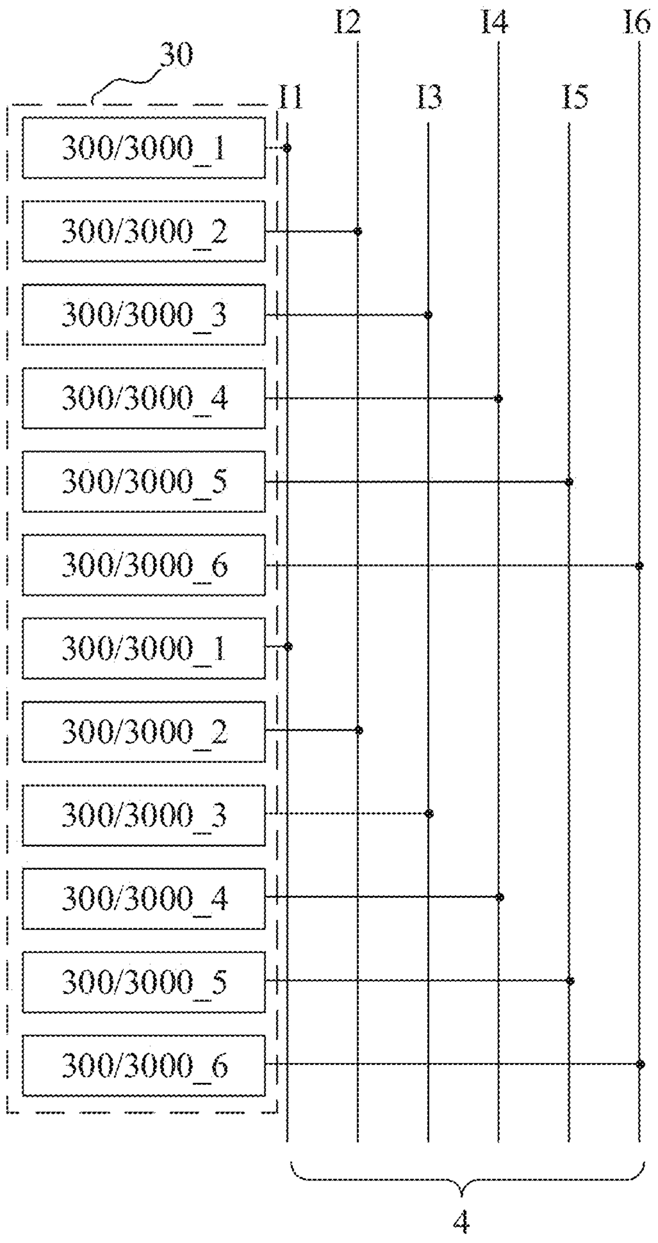
FIG. 11 is a connection diagram of a driving circuit and a first input signal line according to an embodiment of the present disclosure.

FIG. 11 is a connection diagram of a driving circuit and a first input signal line according to an embodiment of the present disclosure. In an embodiment of the present disclosure, as shown in FIG. 1, FIG. 2, FIG. 3 and FIG. 11, the driving signal line 4 includes at least two first input signal lines I.

As shown in FIG. 11, the driving circuit 30 may include at least two driving sub-circuits 3000, and each driving sub-circuit 3000 may include multiple driving units 300. The driving units 300 in a same driving sub-circuit 3000 may be electrically connected to a same first input signal line I, and the driving units 300 in different driving sub-circuits 3000 may be electrically connected to different first input signal lines I.

FIG. 11 further illustrates that the driving signal line 4 may include six first input signal lines I, and the driving circuit 30 may include six driving sub-circuits 3000. For distinction, the six first input signal lines are marked as I1, I2, I3, I4, I5 and I6, and the six driving sub-circuits are marked as 3000_1, 3000_2, 3000_3, 3000_4, 3000_5, and 3000_6, respectively.

Based on such an embodiment, as compared to only one first input signal line, the number of driving units 300 connected to a single first input signal line may be reduced, reducing the load of the first input signal line, and reducing the signal delay time and in-plane non-uniformity, thereby improving the display effect.

In an embodiment of the present disclosure, as shown in FIG. 1 and FIG. 11, in an embodiment of the present disclosure, the first input signal lines I each may be arranged at the second side of the corresponding driving circuit 30, so as to shorten a distance between each first input signal line I and the output module 32 of the corresponding driving unit 300. This may shorten a length of a connection line connecting the first input signal line I and the output module 32, reducing a resistance, and reducing a signal delay.

In an embodiment of the present disclosure, part of the first input signal lines I may be arranged at the first side of the corresponding driving circuit 30. For example, the driving signal line 4 includes n first input signal lines I, where n is an integer greater than or equal to 3. In an embodiment of the present disclosure, p31 first input signal lines I may be arranged at the first side of the driving circuit 30, and p32 first input signal lines I may be arranged at the second side of the driving circuit 30, where p31<p32.

Figure 12:
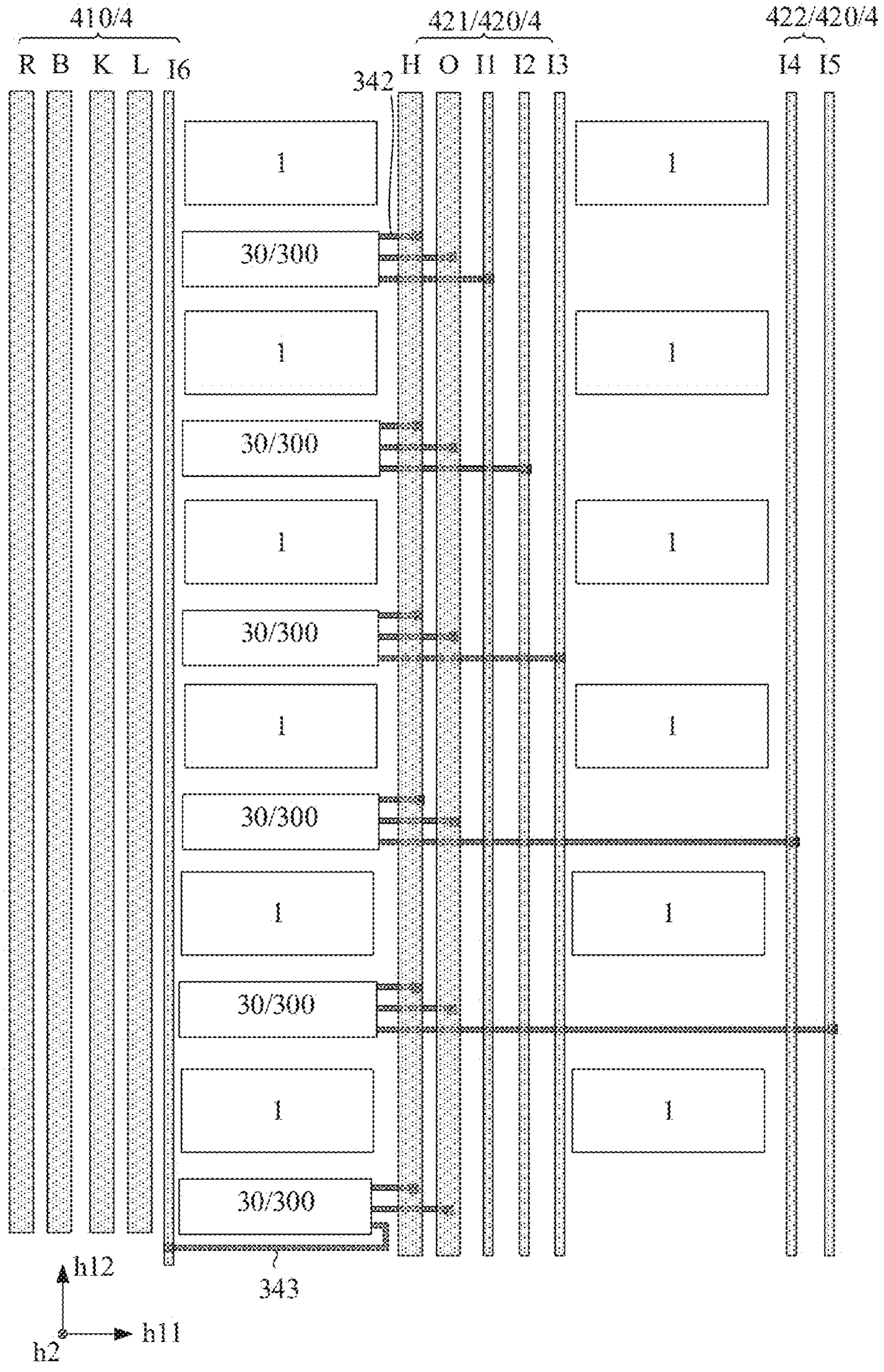
FIG. 12 is a schematic diagram of a display panel according to another embodiment of the present disclosure.

FIG. 12 is a schematic diagram of another display panel according to an embodiment of the present disclosure illustrating this concept. For example, n=6, p31=1, p32=5, and the first input signal line I6 is arranged at the first side of the corresponding driving circuit 30. When the display panel includes multiple first input signal lines I, by arranging part of the first input signal lines I at the first side of the driving circuit 30, as compared to arranging all the first input signal lines I at the second side of the driving circuit 30, the distance between part of the first input signal lines I and the driving circuit 30 may be shortened. As shown in FIG. 12, in an embodiment of the present disclosure, by arranging the first input signal lines I6 at the first side of the driving circuit 30, as compared to arranging the first input signal line I6 on a side of the first input signal lines I5 away from the driving circuit 30, the distance between the first input signal lines I6 and the driving circuit 30 may be shortened, thereby shortening the length of the connection line 343 between the first input signal lines I6 and the driving circuit 30, which in turn may reduce the resistance of the connection line 343 and reduce the signal delay.

In an embodiment of the present disclosure, the display panel 100 includes m pixel driving circuit rows arranged along the second direction h12, and each of pixel driving circuit row includes pixel driving circuits 10 arranged along the first direction h11. In an embodiment of the present disclosure, m=N×n, where m, n, and N are all positive integers. That is, the number of the pixel driving circuit rows is an integer multiple of the number of the first input signal lines I. N may be set according to a display requirement, which is not limited in the embodiments of the present disclosure.

Figure 13:
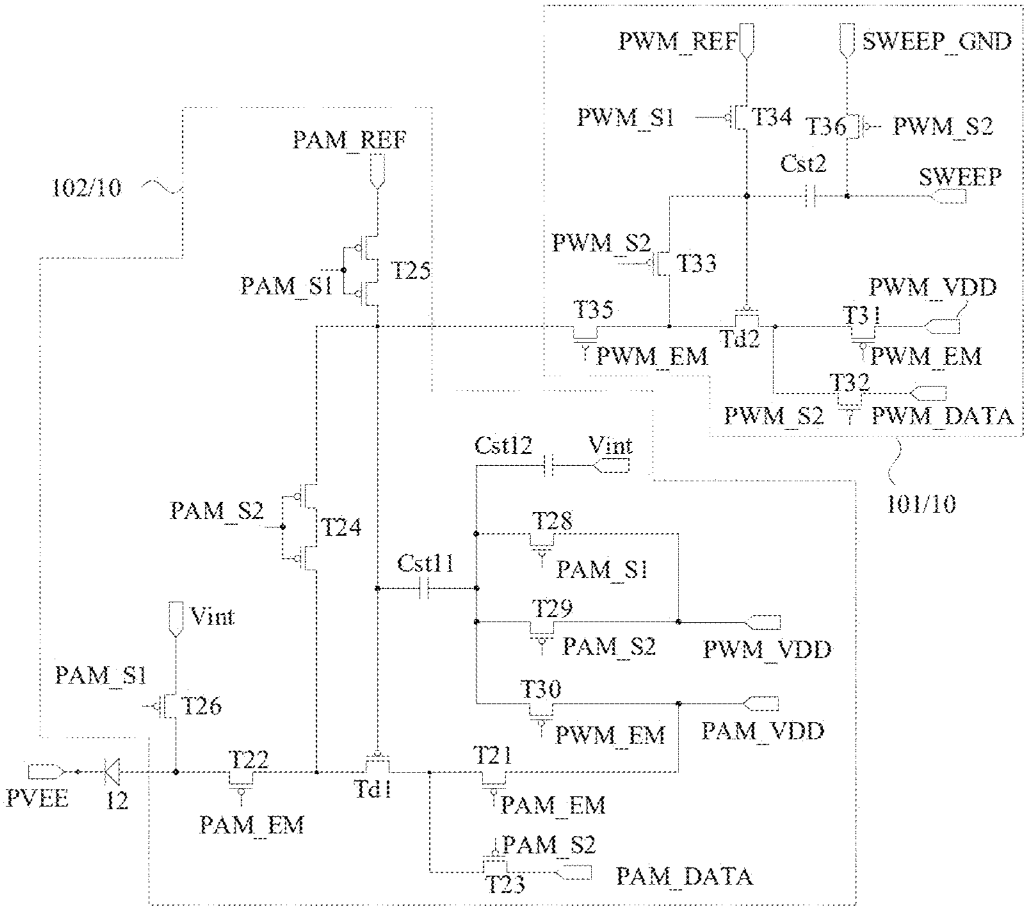
FIG. 13 is a circuit diagram of a pixel driving circuit and a light-emitting element according to an embodiment of the present disclosure.

FIG. 13 is a circuit diagram of a pixel driving circuit and a light-emitting element according to an embodiment of the present disclosure, In the illustrated embodiment, the pixel driving circuit 10 includes a pulse width modulation (PWM) module 101 and a pulse amplitude modulation (PAM) module 102. The pulse width modulation module 101 may output a pulse width setting signal based on a sweep frequency driving signal SWEEP, to control a light-emitting duration of the light-emitting element 12. The pulse amplitude modulation module 102 may control a magnitude of a driving current.

In an embodiment of the present disclosure, as shown in FIG. 13, the pulse amplitude modulation module 102 may include a pulse amplitude light-emitting control module that includes a first light-emitting control transistor T21 and a second light-emitting control transistor T22. The pulse amplitude modulation module 102 may further include a first driving transistor Td1, a pulse amplitude data writing transistor T23, a pulse amplitude compensation transistor T24, a pulse amplitude gate reset transistor T25, a pulse amplitude anode reset transistor T26, and a first storage capacitor Cst11.

A first electrode of the first light-emitting control transistor T21 may be electrically connected to a first power supply terminal PAM_VDD, and a second electrode of the first light-emitting control transistor T21 may be electrically connected to a first electrode of the first driving transistor Td1.

A first electrode of the second light-emitting control transistor T22 may be electrically connected to a second electrode of the first driving transistor Td1, and a second electrode of the second light-emitting control transistor T22 may be electrically connected to a first electrode of the light-emitting element 12.

A gate of the first light-emitting control transistor T21 and a gate of the second light-emitting control transistor T22 may receive a pulse amplitude light-emitting control signal provided by the pulse amplitude light-emitting control signal terminal PAM_EM.

A first electrode of the pulse amplitude data writing transistor T23 may be electrically connected to the first data signal terminal PAM_DATA, and a second electrode of the pulse amplitude data writing transistor T23 may be electrically connected to the first electrode of the first driving transistor Td1.

A first electrode of the pulse amplitude compensation transistor T24 may be electrically connected to the second electrode of the first driving transistor Td1, and a second electrode of the pulse amplitude compensation transistor T24 may be electrically connected to the gate of the first driving transistor Td1.

A first electrode of the pulse amplitude gate reset transistor T25 may be electrically connected to a first reset signal line PAM_REF, and a second electrode of the pulse amplitude gate reset transistor T25 may be electrically connected to the gate of the first driving transistor Td1.

A first electrode of the pulse amplitude anode reset transistor T26 may be electrically connected to an initial signal terminal Vint, and a second electrode of the pulse amplitude anode reset transistor T26 may be electrically connected to the first electrode of the light-emitting element 12.

A gate of the pulse amplitude gate reset transistor T25 and a gate of the pulse amplitude anode reset transistor T26 may receive a first scanning signal provided by a first scanning signal line PAM_S1, and a gate of the pulse amplitude data writing transistor T23 and a gate of the pulse amplitude compensation transistor T24 may receive a second scanning signal provided by a second scanning signal line PAM_S2.

With continued reference to FIG. 13, the pulse width modulation module 1011 may include a third light-emitting control transistor T31, a pulse width data writing transistor T32, a second driving transistor Td2, a pulse width compensation transistor T33, a pulse width gate reset transistor T34, a fourth light-emitting control transistor T35, and a second storage capacitor Cst2.

A first electrode of the third light-emitting control transistor T31 may be electrically connected to a second power supply terminal PWM_VDD, and a second electrode of the third light-emitting control transistor T31 may be electrically connected to a first electrode of the second driving transistor Td2.

A first electrode of the fourth light-emitting control transistor T35 may be electrically connected to a second electrode of the second driving transistor Td2, and a second electrode of the fourth light-emitting control transistor T35 may be electrically connected to the gate of the first driving transistor Td1 in the pulse amplitude modulation module 102.

A first electrode of the pulse width data writing transistor T32 may be electrically connected to a second data signal terminal PWM_DATA, and a second electrode of the pulse width data writing transistor T32 may be electrically connected to the first electrode of the second driving transistor Td2.

A first electrode of the pulse width compensation transistor T33 may be electrically connected to a second electrode of the second driving transistor Td2, and a second electrode of the pulse width compensation transistor T33 may be electrically connected to a gate of the second driving transistor Td2.

A first electrode of the pulse width gate reset transistor T34 may be electrically connected to a second reset signal line PWM_REF, and a second electrode of the pulse width gate reset transistor T34 may be electrically connected to the gate of the second driving transistor Td2.

A first electrode plate of the second storage capacitor Cst2 may be electrically connected to a sweep frequency signal terminal SWEEP, and the second electrode plate of the second storage capacitor Cst2 may be electrically connected to the gate of the second driving transistor Td2.

A gate of the third light-emitting control transistor T31 and a gate of the fourth light-emitting control transistor T35 may be electrically connected to a pulse width light-emitting control signal line PWM_EM to receive a pulse width light-emitting control signal provided by the pulse width light-emitting control signal line PWM_EM.

A gate of the pulse width gate reset transistor T34 may be electrically connected to a third scanning signal line PWM_S1 to receive a third scanning signal provided by the third scanning signal line PWM_S1.

Gates of the pulse width data writing transistor T32 and the pulse width compensation transistor T33 may be electrically connected to a fourth scanning signal line PWM_S2 to receive a fourth scanning signal provided by the fourth scanning signal line PWM_S2.

In an embodiment of the present disclosure, as shown in FIG. 13, the pulse amplitude modulation module 102 further includes a first compensation transistor T28, a second compensation transistor T29, a third compensation transistor T30, and a third storage capacitor Cst12. A first electrode of the first compensation transistor T28 and a first electrode of the second compensation transistor T29 may both be electrically connected to the second power supply terminal PWM_VDD. A first electrode of the third compensation transistor T30 may be electrically connected to the first power supply terminal PAM_VDD. A second electrode of the first compensation transistor T28, a second electrode of the second compensation transistor T29, and a second electrode of the third compensation transistor T30 may all be electrically connected to a first electrode plate of the first storage capacitor Cst11. A second electrode plate of the first storage capacitor Cst11 may be electrically connected to the gate of the first driving transistor Td1. In addition, a gate of the first compensation transistor T28 may receive the first scanning signal provided by the first scanning signal line PAM_S1. A gate of the second compensation transistor T29 may receive the second scanning signal provided by the second scanning signal line PAM_S2. A gate of the third compensation transistor T30 may be electrically connected to the pulse width light-emitting control signal line PWM_EM to receive the pulse width light-emitting control signal provided by the pulse width light-emitting control signal line PWM_EM.

A first electrode plate of the third storage capacitor Cst12 may be electrically connected to the initial signal terminal Vint, and a second electrode plate of the third storage capacitor Cst12 may be electrically connected to the first electrode plate of the first storage capacitor Cst11.

With continued reference to FIG. 13, the pulse width modulation module 101 may further include a sweep frequency control transistor T36. The sweep frequency control transistor T36 may be electrically connected to the fourth scanning signal line PWM_S2. The first electrode may be electrically connected to a sweep frequency ground signal line SWEEP_GND, and the second electrode may be electrically connected to the first electrode plate of the second storage capacitor Cst2.

When the pixel driving circuit 10 is operating, the first electrode of the second driving transistor Td2 of the pulse width modulation module 101 is provided with a reference voltage (such as a voltage on the second power supply terminal PWM_VDD), and a varying potential is formed at the gate of the second driving transistor Td2 through the data voltage on the second data signal terminal PWM_DATA and the sweep frequency signal on the sweep frequency signal terminal SWEEP. When a voltage difference between the gate and the first electrode of the second driving transistor Td2 is greater than a threshold voltage of the second driving transistor Td2, the second driving transistor Td2 is in an off state, such that that the pulse width modulation module 101 does not provide a control signal to the pulse amplitude modulation module 102, and the first driving transistor Td1 in the pulse amplitude modulation module 102 provides a light-emitting driving current to the light-emitting element 12 according to the voltage on the first data signal line PAM_DATA.

As the voltage of a signal transmitted by the sweep frequency signal terminal SWEEP changes, the potential of the gate of the second driving transistor Td2 changes synchronously until the voltage difference between the gate and the first electrode of the second driving transistor Td2 is equal to (or less than) the threshold voltage of the second driving transistor Td2. The second driving transistor Td2 is turned on, and the second driving transistor Td2 transmits the voltage on the second power supply terminal PWM_VDD to the pulse amplitude modulation module 102 as an off voltage, such that that the first driving transistor Td1 in the pulse amplitude modulation module 102 is turned off, thereby stopping a driving current to the light-emitting element 12. It should be understood that the pulse width modulation module 101 may control the duration of outputting the light-emitting driving current by the pulse amplitude modulation module 102, thereby adjusting the effective light-emitting duration of the light-emitting element 12 within a frame time, and further adjusting the light-emitting brightness of the light-emitting element 12.

Figure 14:
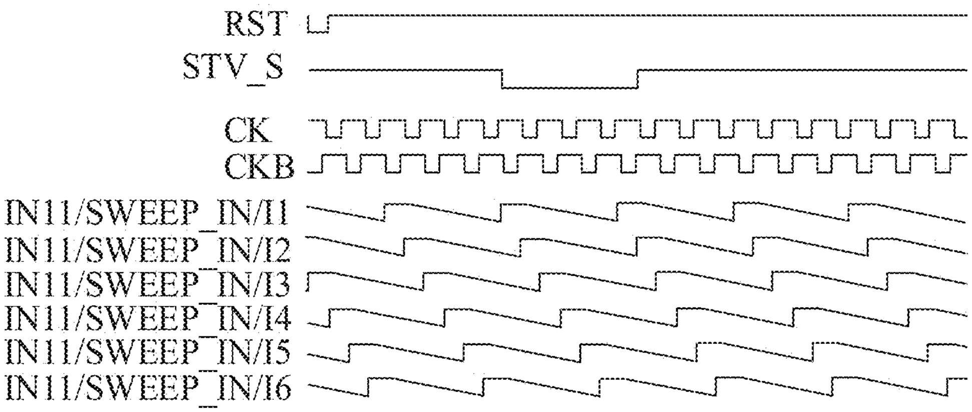
FIG. 14 is an operating timing diagram of a driving circuit according to an embodiment of the present disclosure.

FIG. 14 is an operating timing diagram of a driving circuit according to an embodiment of the present disclosure. In the illustrated embodiment, the first control signal includes a sweep frequency driving signal SWEEP. Correspondingly, the first input signal line I may transmit a sweep frequency input signal SWEEP_IN. The sweep frequency input signal SWEEP_IN may include a ramp signal. A start signal STV_S may be provided to a third input terminal IN2 of a first-stage driving unit 300 in the driving circuit 30.

Figure 15:
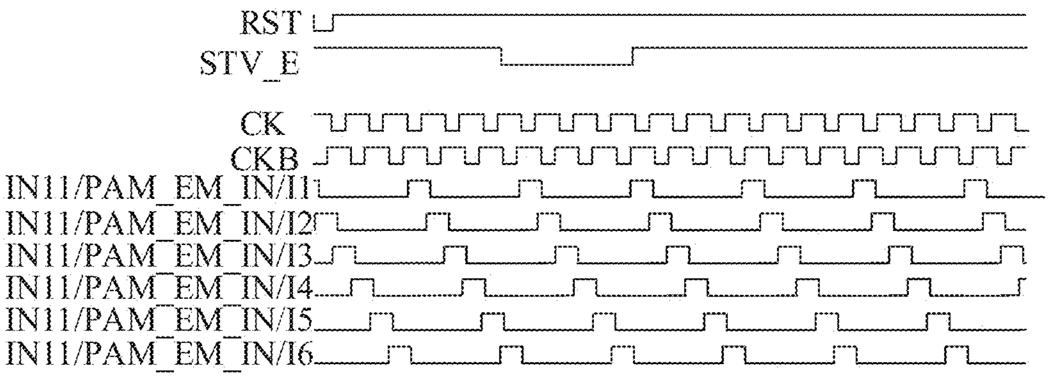
FIG. 15 is an operating timing diagram of a driving circuit according to another embodiment of the present disclosure.

FIG. 15 is an operating timing diagram of a driving circuit according to another embodiment of the present disclosure. In the illustrated embodiment, the first control signal includes a pulse amplitude light-emitting control signal PAM_EM. Correspondingly, the first input signal line I may also transmit a pulse amplitude light-emitting control input signal PAM_EM_IN. The pulse amplitude light-emitting control input signal PAM_EM_IN may include a square wave signal. A start signal STV_E may be provided to the third input terminal IN2 of the first-stage driving unit 300 in the driving circuit 30.

For example, as shown in FIG. 1, FIG. 2, FIG. 3, and FIG. 12, the driving signal line 4 further includes a reset signal line R, a first clock signal line K, a second clock signal line B, a first level signal line L, a second level signal line H, and a second input signal line O that are electrically connected to the control module 31. The reset signal line R may be electrically connected to the reset signal terminal RST of the driving circuit 30, the first clock signal line K may be electrically connected to the first clock signal terminal CK of the driving circuit 30, the second clock signal line B may be electrically connected to the second clock signal terminal CKB of the driving circuit 30, the first level signal line L may be electrically connected to the first level signal terminal VGL of the driving circuit 30, the second level signal line H may be electrically connected to the second level signal terminal VGH of the driving circuit 30, and the second input signal line O may be electrically connected to the second input signal terminal IN12 of the driving circuit 30.

In an embodiment of the present disclosure, at least one of the reset signal line R, the first clock signal line K, the second clock signal line B and the first level signal line L is arranged at the first side of the corresponding driving circuit 30. FIG. 2 illustrates that the reset signal line R, the first clock signal line K, the second clock signal line B and the first level signal line L are all arranged at the first side of the corresponding driving circuit 30.

In an embodiment of the present disclosure, the trace region A2 further includes multiple pixel signal lines required for the operation of the pixel driving circuit 10. As shown in FIG. 1, the pixel signal lines include at least one first data signal line PAMD, at least one second data signal line PWMD and at least one first power supply voltage line PWMV. The first data signal line PAMD may be electrically connected to the first data signal terminal PAM_DATA of the pixel driving circuit 10 shown in FIG. 13. The second data signal line PWMD may be electrically connected to the second data signal terminal PWM_DATA of the pixel driving circuit 10 shown in FIG. 11, and the first power supply voltage line PWMV may be electrically connected to the second power supply terminal PWM_VDD of the pixel driving circuit 10 shown in FIG. 13.

In an embodiment of the present disclosure, when the circuit unit 1 includes multiple pixel driving circuits 10, such as a first pixel driving circuit 101; a second pixel driving circuit 102; and a third pixel driving circuit 103 that each provide driving currents to a first color light-emitting element, a second color light-emitting element, and a third color light-emitting element, respectively; the trace region A2 includes three first data signal lines PAMD and three second data signal lines PWMD. The three first data signal lines PAMD may be electrically connected to the first pixel driving circuit 101, the second pixel driving circuit 102, and the third pixel driving circuit 103, respectively; and the three second data signal lines PWMD may be electrically connected to the first pixel driving circuit 101, the second pixel driving circuit 102, and the third pixel driving circuit 103, respectively. As shown in FIG. 1, the first data signal lines PAMD and the second data signal lines PWMD may be arranged at a first side and a second side of the corresponding circuit unit 1, respectively.

As shown in FIG. 1, the driving signal line 4 may further include a cascade signal line 401 that is configured to connect two adjacent stages of driving units 300 in the driving circuit 30. As shown in FIG. 10, a first output signal terminal OUT1 of the previous stage of driving unit may be connected to a third input signal terminal IN2 of the next stage of driving unit through the cascade signal line 401.

As shown in FIG. 1, the trace region A2 may further include a control connection line 402 electrically connecting the driving circuit 3 and the first control signal line 21.

As shown in FIG. 1, at least part of the cascade signal line 401 may be arranged at a first side of the corresponding driving circuit 3, and at least part of the control connection line 402 may be arranged at a second side of the corresponding driving circuit 3, to further balance the number of traces on both sides of the driving circuit 3 in the first direction h11, such that coverage areas of the traces on both sides of the driving circuit 3 tend to be as consistent as possible, thereby improving display uniformity.

Figure 16:
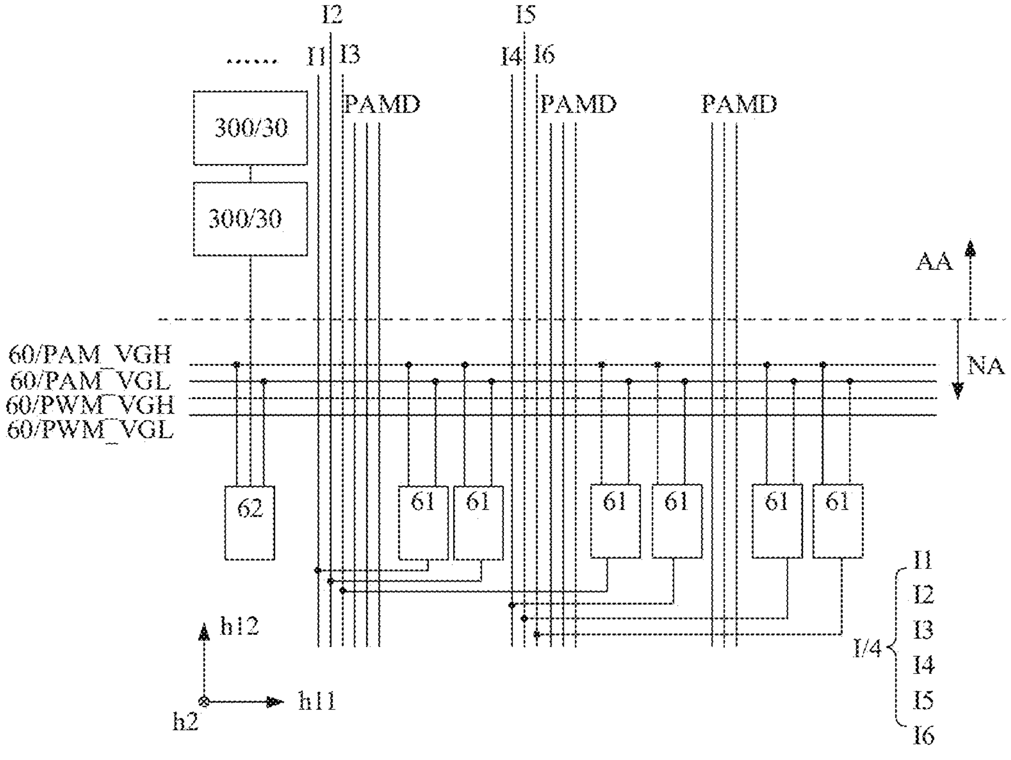
FIG. 16 is a schematic diagram of an electrostatic protection circuit according to an embodiment of the present disclosure.

FIG. 16 is a schematic diagram of an electrostatic protection circuit according to an embodiment of the present disclosure. In the illustrated embodiment, the display panel 100 further includes a non-display area Na that includes multiple first electrostatic protection circuits 61. The first electrostatic protection circuits 61 may be electrically connected in one-to-one correspondence to the driving signal lines 4.

Figure 17:
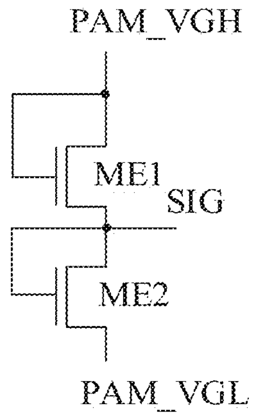
FIG. 17 is a circuit diagram of an electrostatic protection circuit according to an embodiment of the present disclosure.

FIG. 17, which is a circuit diagram of an electrostatic protection circuit according to an embodiment of the present disclosure. In the illustrated embodiment, the electrostatic protection circuit includes a first electrostatic protection transistor ME1 and a second electrostatic protection transistor ME2. A gate and a first electrode of the first electrostatic protection transistor ME1 may both be electrically connected to a first constant level signal line PAM_VGH, and a second electrode of the first electrostatic protection transistor ME1 may be electrically connected to a signal terminal SIG to be protected. In an embodiment of the present disclosure, the signal terminal SIG to be protected may be electrically connected to any one of the driving signal lines 4. A gate and a first electrode of the second electrostatic protection transistor ME2 may both be electrically connected to a second constant level signal line PAM_VGL, and a second electrode of the second electrostatic protection transistor ME2 may be electrically connected to the signal terminal SIG to be protected.

When static electricity is generated in the driving signal line 4, the electrostatic protection circuit is automatically turned on under the control of an electrostatic signal, and the static electricity can be conducted away through a turned-on electrostatic protection circuit via the first constant level signal line PAM_VGH or the second constant level signal line PAM_VGL. For example, when an electrostatic voltage in the driving signal line 4 is high-voltage electrostatic, the first electrostatic protection transistor ME1 is turned on, and a high-voltage electrostatic signal is released to the first constant level signal line PAM_VGH through the first electrostatic protection transistor ME1. When the electrostatic voltage in the driving signal line 4 is low-voltage electrostatic, the second electrostatic protection transistor ME2 is turned on, and the low-voltage electrostatic signal is released to the second constant level signal line PAM_VGL through the second electrostatic protection transistor ME2, thereby implementing electrostatic discharge.

In an embodiment of the present disclosure, as shown in FIG. 16, the first electrostatic protection circuits 61 are arranged along the first direction h11, to reduce the occupied space of the first electrostatic protection circuits 61 in the second direction h12.

In an embodiment of the present disclosure, the non-display area NA further includes multiple pads (not shown), and the pads are electrically connected in one-to-one correspondence to the driving signal lines 4.

As shown in FIG. 16, the display panel may further include a first data signal line PAMD and a second data signal line PWMD. The number of the first electrostatic protection circuits 61 between the first data signal line PAMD and the second data signal line PWMD is merely illustrative. In an embodiment of the present disclosure, the number of the first electrostatic protection circuits 61 may be adjusted according to the space between the first data signal line PAMD and the second data signal line PWMD, which is not limited in the embodiments of the present disclosure.

As shown in FIG. 16, the display panel may further include at least a second electrostatic protection circuit 62 that is electrically connected to an output terminal of the last-stage driving unit 300. In the second electrostatic protection circuit 62, a second electrode of the first electrostatic protection transistor, and a gate and a first electrode of the second electrostatic protection transistor may all be electrically connected to the output terminal of the last-stage driving unit 300. The second electrostatic protection circuit 62 may be configured to protect the last-stage driving unit 300 from electrostatic damage.

As shown in FIG. 16, the first electrostatic protection circuit 61 and the second electrostatic protection circuit 62 may be arranged along the first direction h11, so as to reduce the occupied space of the first electrostatic protection circuit 61 and the second electrostatic protection circuit 62 in the second direction h12.

Figure 18:
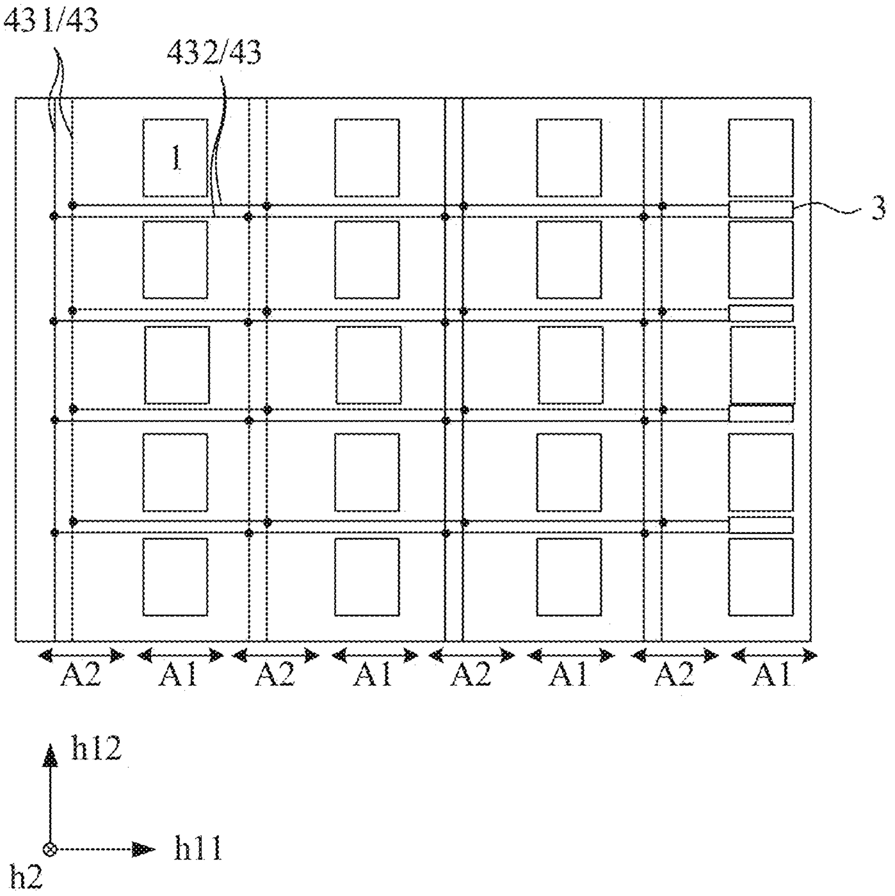
FIG. 18 is a schematic diagram of another display panel according to an embodiment of the present disclosure.

FIG. 18 is a schematic diagram of a display panel according to another embodiment of the present disclosure. In the illustrated embodiment, the driving signal lines 4 at least include a third driving signal line 43. The third driving signal line 43 may include at least two third sub-driving signal lines 431 transmitting the same signal and arranged in different trace regions A2, and two adjacent third sub-driving signal lines 431 may be electrically connected through a fourth sub-driving signal line 432. The third sub-driving signal line 431 may extend along the second direction h12, and the fourth sub-driving signal line 432 may extend along the first direction h11. Based on such embodiment, the resistance of the third driving signal line 43 may be reduced, and the signal in-plane uniformity may be increased.

For example, the third driving signal line 43 includes any one of the reset signal line R, the first clock signal line K, the second clock signal line B, the first level signal line L, the second level signal line H, the second input signal line O, and the first input signal line I.

Figure 19:
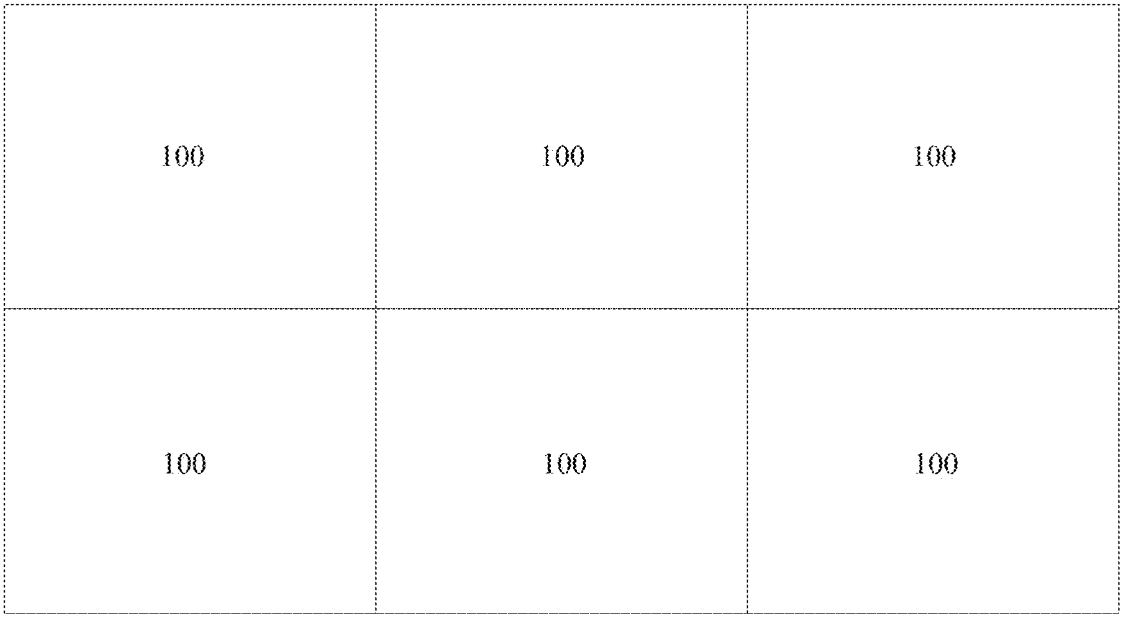
FIG. 19 is a schematic diagram of a display apparatus according to an embodiment of the present disclosure.

FIG. 19 is a schematic diagram of a display apparatus according to an embodiment of the present disclosure. Based on the same inventive concept discussed above, an embodiment of the present disclosure further provides a display apparatus, including the display panel 100.

In an embodiment of the present disclosure, as shown in FIG. 19, the display apparatus includes a spliced display apparatus. The spliced display apparatus may include at least two of the display panels 100, so as to be suitable for a large-screen display apparatuses having a display function, such as a frameless spliced display apparatus.

In an embodiment of the present disclosure, such spliced display apparatus may be applied to public information display (PID) scenarios such as stations and airports. When the spliced display apparatus includes the display panel 100, a seamless/frameless spliced effect of the spliced display apparatus may be achieved.

The above description is only a preferred embodiment of the present disclosure and is not intended to limit the present disclosure, and any modifications, equivalent substitutions, improvements and the like made within the spirit and principle of the present disclosure should be included within the scope of the present disclosure.

Finally, it should be noted that, the above embodiments are merely used to illustrate the technical solutions of the present disclosure, but not to limit the same. Although the present disclosure has been described in detail with reference to the above embodiments, those skilled in the art should understand that the technical solutions described in the above embodiments of the present disclosure may still be modified, or some or all of the technical features may be equivalently replaced. These modifications or substitutions do not make the essence of the corresponding technical solutions depart from the scope of the technical solutions in the embodiments of the present disclosure.

What is claimed is:

1. A display panel, comprising a display area and a plurality of driving signal lines, wherein the display area comprises a plurality of circuit regions and a plurality of trace regions that are alternately arranged along a first direction, one of the plurality of circuit regions comprises a plurality of circuit units arranged along a second direction, one of the plurality of circuit units comprises a pixel driving circuit, and the first direction intersects with the second direction;

wherein the display area further comprises a first plurality of control signal lines electrically connected to the pixel driving circuit;

wherein at least part of the plurality of circuit regions comprises a driving circuit, the driving circuit comprises a plurality of driving units that is at least partially arranged between two adjacent circuit units in the second direction, and the driving circuit is electrically connected to one of the first plurality of control signal lines;

wherein the plurality of driving signal lines extends along the second direction and is electrically connected to the driving circuit;

wherein along the first direction, at least part of the plurality of driving signal lines electrically connected to a same driving circuit is arranged at a first side of a corresponding driving circuit, and at least another part of the plurality of driving signal lines is arranged at a second side of the corresponding driving circuit;

wherein the driving circuit comprises a control module and an output module that are arranged along the first direction; and wherein at least one of the plurality of driving signal lines at the first side of the corresponding driving circuit is electrically connected to the control module, and at least one of the plurality of driving signal lines at the second side of the corresponding driving circuit is electrically connected to the output module.

2. The display panel according to claim 1, wherein the control module is arranged at a side of the driving circuit adjacent to the first side, and the output module is arranged at a side of the driving circuit adjacent to the second side; and the display panel comprises q1 driving signal lines arranged at the first side of a corresponding driving circuit, and q2 driving signal lines arranged at the second side of the corresponding driving circuit, where $q1<q2$.

3. The display panel according to claim 1, wherein a line width of at least one of q1 driving signal lines at the first side of the corresponding driving circuit is greater than a line width of at least one of q2 driving signal lines at the second side of the corresponding driving circuit.

4. The display panel according to claim 1, wherein the at least part of the driving signal lines at the first side of the driving circuit comprise at least two first driving signal line groups, and one of the at least two first driving signal line groups comprises at least one of the driving signal lines; and along the first direction, at least one of the plurality of circuit units is included between two adjacent first driving signal line groups; and/or the at least another part of the driving signal lines at the second side of the driving circuit comprise at least two second driving signal line groups, and one of the at least two second driving signal line groups comprises at least one of the driving signal lines; and along the first direction, at least one of the plurality of circuit units is included between two adjacent second driving signal line groups.

5. The display panel according to claim 4, wherein the at least two second driving signal line groups at the second side of the driving circuit at least comprise a first subgroup and a second subgroup, and the second subgroup is arranged at a side of the first subgroup away from the driving circuit, wherein the first subgroup comprises q21 driving signal lines, and the second subgroup comprises q22 driving signal lines, where $q21>q22$.

6. The display panel according to claim 4, wherein the at least part of the driving signal lines at the first side of the driving circuit comprise two first driving signal line groups, and the two driving signal lines at the second side of the driving circuit comprise three second driving signal line groups;

one of the two first driving signal line groups comprises two driving signal lines; and the three second driving signal line groups comprise a third subgroup, a fourth subgroup and a fifth subgroup, the third subgroup is arranged at a side of the fourth subgroup adjacent to the driving circuit, and the fifth subgroup is arranged at a side of the fourth subgroup away from the driving circuit; and the third subgroup comprises two driving signal lines, and the fourth subgroup and the fifth subgroup both comprise three driving signal lines.

7. The display panel according to claim 6, wherein a total line width of the two driving signal lines in the third subgroup is equal to a total line width of the two driving signal lines in the first driving signal line group; and a line width of at least one of the driving signal lines in the fourth subgroup and the fifth subgroup is less than a line width of at least one of the driving signal lines in the third subgroup.

8. The display panel according to claim 7, wherein a total line width of driving signal lines in the third subgroup is d1, a total line width of driving signal lines in the fourth subgroup is d2, and a total line width of driving signal lines in the fifth subgroup is d3, where $$\frac{d2-d1}{d1} \leq 30\%, \text{ and } \frac{d3-d1}{d1} \leq 30\%.$$

9. The display panel according to claim 1, comprising:
a first signal line extending along the first direction, wherein the first signal line and the plurality of driving signal lines transmit different signals;
wherein the plurality of driving signal lines comprises at least one through hole, and the at least one through hole at least partially overlaps the first signal line along a direction perpendicular to a plane of the display panel;
wherein the plurality of driving signal lines comprises a first driving signal line and a second driving signal line, and a line width of the first driving signal line is greater than a line width of the second driving signal line; and
wherein an area of the at least one through hole in the first driving signal line is greater than an area of the through hole in the second driving signal line.

10. The display panel according to claim 9, wherein
the at least one through hole comprises a first through hole, and the first through hole overlaps at least two adjacent first signal lines along a direction perpendicular to the plane of the display panel; or
wherein the first signal line comprises a first sub-signal line and a second sub-signal line, along the direction perpendicular to the plane of the display panel, the first sub-signal line at least partially overlaps the at least one through hole, the second sub-signal line at least partially does not overlap the at least one through hole, and a line width of the first sub-signal line is greater than or equal to a line width of the second sub-signal line; or
wherein the display panel further comprises a substrate, wherein the plurality of driving signal lines is arranged at a side of the first signal line away from the substrate along a direction perpendicular to a plane of the substrate.

11. The display panel according to claim 1, wherein
the plurality of circuit units comprises at least a first circuit unit and a second circuit unit arranged along the first direction;
the driving circuit comprises a first portion and a second portion arranged along the first direction;
the first portion corresponds to the first circuit unit, and the second portion corresponds to the second circuit unit; and
the driving signal lines further comprise a third driving signal line group arranged between the first portion and the second portion.

12. The display panel according to claim 1, wherein
the driving circuit comprises a control module and an output module that are arranged along the first direction, the control module is arranged at a side of the driving circuit adjacent to the first side, and the output module is arranged at a side of the driving circuit adjacent to the second side; and
the driving signal lines comprises at least one first input signal line electrically connected to the output module, and the at least one first input signal line is arranged at a second side of the driving circuit.

13. The display panel according to claim 12, wherein
the driving signal lines comprises at least two first input signal lines; and
the driving circuit comprises at least two driving sub-circuits, one of the at least two driving sub-circuits comprises the driving units, the driving units in a same driving sub-circuit are electrically connected to a same first input signal line, and the driving units in different driving sub-circuits are electrically connected to different first input signal lines.

14. The display panel according to claim 13, wherein
the plurality of driving signal lines comprise n first input signal lines, where n is an integer greater than or equal to 3; and p31 first input signal lines are arranged at a first side of the driving circuit, and p32 first input signal lines are arranged at the second side of the driving circuit, where $p31<p32$; or
wherein the display panel further comprises m pixel driving circuit rows arranged along the second direction, wherein the m pixel driving circuit rows comprise pixel driving circuits that are arranged along the first direction, where $m=N\times n$, and m, n, and N are all positive integers.

15. The display panel according to claim 12, wherein
the pixel driving circuit comprises a pulse width modulation module that outputs a pulse width setting signal based on a sweep frequency driving signal, to control a light-emitting duration of a light-emitting element; and
the first input signal line transmits a sweep frequency input signal, the first control signal comprises the sweep frequency driving signal, and the sweep frequency input signal comprises a ramp signal; or
the pixel driving circuit comprises a pulse amplitude light-emitting control module, the driving circuit provides a pulse amplitude light-emitting control signal to the pulse amplitude light-emitting control module, the first input signal line transmits a pulse amplitude light-emitting control input signal, the first control signal comprises the pulse amplitude light-emitting control signal, and the pulse amplitude light-emitting control input signal comprises a square wave signal.

16. The display panel according to claim 12, wherein
the plurality of driving signal lines further comprises a reset signal line, a first clock signal line and a second clock signal line that are electrically connected to the control module; and
at least one of the reset signal line, the first clock signal line and the second clock signal line is arranged at a first side of the driving circuit.

17. The display panel according to claim 1, further comprising:
first electrostatic protection circuits electrically connected in one-to-one correspondence to the driving signal lines, wherein
the first electrostatic protection circuits are arranged along the first direction.

18. The display panel according to claim 17, wherein
the driving circuit comprises cascaded driving units;
the electrostatic protection circuits further at least comprise a second electrostatic protection circuit, and in the second electrostatic protection circuit, a second electrode of a first electrostatic protection transistor, a gate of a second electrostatic protection transistor and a first electrode of a second electrostatic protection transistor are all electrically connected to an output end of driving units of a last stage; and
the first electrostatic protection circuit and the second electrostatic protection circuit are arranged along the first direction.

19. The display panel according to claim 1, wherein the driving signal lines comprise a third driving signal line that comprises at least two third sub-driving signal lines transmitting a same signal and arranged in different trace regions, and two adjacent third sub-driving signal lines of the at least two third sub-driving signal lines are electrically connected through a fourth sub-driving signal line; and the third sub-driving signal line extends along the second direction, and the fourth sub-driving signal line extends along the first direction.

20. A display apparatus, comprising a display panel, wherein the display panel comprises a display area and a plurality of driving signal lines, wherein the display area comprises a plurality of circuit regions and a plurality of trace regions that are alternately arranged along a first direction, one of the plurality of circuit regions comprises a plurality of circuit units arranged along a second direction, one of the plurality of circuit units comprises a pixel driving circuit, and the first direction intersects with the second direction;

wherein the display area further comprises a first plurality of control signal lines electrically connected to the pixel driving circuit;

wherein at least part of the plurality of circuit regions comprises a driving circuit, the driving circuit comprises a plurality of driving units that is at least partially arranged between two adjacent circuit units in the second direction, and the driving circuit is electrically connected to one of the first plurality of control signal lines;

wherein the plurality of driving signal lines extends along the second direction and is electrically connected to the driving circuit;

wherein along the first direction, at least part of the plurality of driving signal lines electrically connected to a same driving circuit is arranged at a first side of a corresponding driving circuit, and at least another part of the plurality of driving signal lines is arranged at a second side of the corresponding driving circuit;

wherein the driving circuit comprises a control module and an output module that are arranged along the first direction; and wherein at least one of the plurality of driving signal lines at the first side of the corresponding driving circuit is electrically connected to the control module, and at least one of the plurality of driving signal lines at the second side of the corresponding driving circuit is electrically connected to the output module.

* * * * *